US007920668B2

(12) United States Patent
Lee

(10) Patent No.: US 7,920,668 B2
(45) Date of Patent: Apr. 5, 2011

(54) SYSTEMS FOR DISPLAYING IMAGES BY UTILIZING VERTICAL SHIFT REGISTER CIRCUIT TO GENERATE NON-OVERLAPPED OUTPUT SIGNALS

(75) Inventor: Ching-Hone Lee, Hsin-Chu (TW)

(73) Assignee: Chimei Innolux Corporation (TW)

( * ) Notice: Subject to any disclaimer, the term of this patent is extended or adjusted under 35 U.S.C. 154(b) by 1126 days.

(21) Appl. No.: 11/650,212

(22) Filed: Jan. 5, 2007

(65) Prior Publication Data
US 2008/0165169 A1 Jul. 10, 2008

(51) Int. Cl.
*G11C 19/00* (2006.01)

(52) U.S. Cl. .............. 377/64; 377/78; 377/79; 327/202; 327/203; 327/218

(58) Field of Classification Search .................. None
See application file for complete search history.

(56) References Cited

U.S. PATENT DOCUMENTS

| 3,610,951 A * | 10/1971 | Howland | 377/79 |
|---|---|---|---|
| 3,789,239 A * | 1/1974 | Heeren | 377/79 |
| 3,900,747 A * | 8/1975 | Yamazaki et al. | 327/534 |
| 3,937,984 A * | 2/1976 | Fry | 377/79 |
| 4,651,333 A * | 3/1987 | Cappon | 377/77 |
| 4,890,308 A * | 12/1989 | Imai | 377/79 |
| 4,922,138 A * | 5/1990 | Hashimoto et al. | 326/97 |
| 6,002,285 A * | 12/1999 | Muhich et al. | 327/208 |
| 6,348,825 B1 * | 2/2002 | Galbi et al. | 327/218 |
| 6,617,902 B2 * | 9/2003 | Tokumasu et al. | 327/211 |
| 7,590,214 B2 * | 9/2009 | Liu et al. | 377/64 |
| 2005/0184763 A1 * | 8/2005 | Kondo | 327/94 |
| 2005/0220263 A1 * | 10/2005 | Moon | 377/68 |
| 2008/0180139 A1 * | 7/2008 | Natonio et al. | 327/117 |

* cited by examiner

Primary Examiner — Tuan Lam
(74) Attorney, Agent, or Firm — Thomas, Kayden, Horstemeyer & Risley, LLP.

(57) ABSTRACT

Systems for displaying images are provided. An embodiment of such a system has a dynamic shift register. The dynamic shift register includes a sampling unit, a holding unit, and a first logic circuit. The sampling unit, which is coupled to an incoming signal and a first input terminal of the dynamic shift register, samples the incoming signal according to a first input signal received by the first input terminal to generate a sampled value. The holding unit, which is coupled to the sampling unit, is utilized to hold the sampled value. The first logic circuit, which is coupled to the holding unit and an output terminal of the dynamic shift register, generates an output signal according to the sampled value and a second input signal inputted into the first logic circuit.

21 Claims, 21 Drawing Sheets

US 7,920,668 B2

SYSTEMS FOR DISPLAYING IMAGES BY UTILIZING VERTICAL SHIFT REGISTER CIRCUIT TO GENERATE NON-OVERLAPPED OUTPUT SIGNALS

BACKGROUND OF THE INVENTION

1. Field of the Invention

The present invention relates to displaying images, especially to system for displaying images by utilizing a vertical shift register circuit for generating non-overlapped output signals.

2. Description of the Prior Art

Generally, liquid crystal displays (LCDs) display images utilizing electric fields to control the light transmittance characteristics of liquid crystal material. Accordingly, LCDs include a liquid crystal display panel having liquid crystal cells arranged in a matrix pattern and a driving circuit for driving the liquid crystal display panel.

Gate lines and data lines are arranged within the liquid crystal display panel such that their arrangement caused them to cross each other. Liquid crystal cells are arranged at crossings of the gate and data lines. Liquid crystal display panels include pixel electrodes and a common electrode that apply electric fields to each of the liquid crystal cells. Each pixel electrode is connected to a corresponding data line via source or drain terminals of a switching device such as a thin film transistor (TFT). A gate terminal of each of the thin film transistors is connected to a corresponding gate line.

Driving circuits include a gate driver and a data driver. The gate driver sequentially drives the liquid crystal cells on the liquid crystal display panel by sequentially applying a scanning signal to the gate lines. When the gate lines are supplied with the scanning signal, the data driver applies a video signal to respective ones of the data lines. Pictures are displayed by applying an electric field between pixel electrodes of each of the liquid crystal cells in the LCD panel and the common electrode. Electric fields are applied in accordance with inputted video signals.

Dynamic shift registers are the most frequently utilized devices to generate the scanning signal. Please refer to FIG. 1. FIG. 1 shows a prior art shift register circuit 100. The shift register circuit 100 contains six dynamic shift registers 110 through 160, each of which has the same inner circuit shown in FIG. 2. The function of the circuit shown in FIG. 2 is well known to those skilled in the art, so the detailed description is omitted for brevity. Please refer to both FIG. 1 and FIG. 2. Each dynamic shift register has three input terminals, IN, $C_1$, and $C_2$, and an output terminal OUT. The dynamic shift register 110 receives an input signal (i.e., a start-up signal) STV at the input terminal IN. Other dynamic shift registers 120 through 160 receive the output signal of the preceding dynamic shift register as its own input signal. For example, the dynamic shift register 120 receives the output signal outputted at the output terminal OUT of the dynamic shift register 110 as its own input signal. The two input terminals $C_1$ and $C_2$ of each dynamic shift register 110 through 160 receive clock signals. Two adjacent dynamic shift registers alternatively receive two clock signals $CK_1$ and $CK_2$ respectively at these two input terminals $C_1$ and $C_2$. For example, the dynamic shift register 110 receives the clock signal $CK_1$ at the input terminal $C_1$, and receives the clock signal $CK_2$ at the input terminal $C_2$; however, the dynamic shift register 120 receives the clock signal $CK_2$ at the input terminal $C_1$, and receives the clock signal $CK_1$ at the input terminal $C_2$. The waveforms of the input signal STV, the two clock signals $CK_1$ and $CK_2$, and the output signals $G_1$ through $G_6$ are shown in FIG. 3.

As shown in FIG. 3, the output signals of two adjacent dynamic shift registers, e.g. $G_1$ and $G_2$, are overlapped. In some applications, output signals that are not overlapped are required. Therefore, if the aforementioned shift register circuit 100 is implemented in a vertical shift register circuit, an additional circuit is needed by the vertical shift register circuit to generate non-overlapped output signals according to these overlapped output signals generated from the shift register circuit 100. Please refer to FIG. 4. A logic circuit 400 is utilized to split overlapped output signals. The logic circuit 400 comprises a NAND gate 410 and an inverter 420. The NAND gate 410 receives three input signals that consist of two output signals of two adjacent dynamic shift registers, e.g. $G_1$ and $G_2$, and a signal ENB. It is apparent that the output signal $X_1$ of the logic circuit 400 is equal to "G1˙G2˙ENB". FIG. 5 shows the waveforms of three output signals of the shift register circuit 100, e.g. $G_1$, $G_2$, and $G_3$, the signal ENB, and two split signals $X_1$ and $X_2$. Two logic circuits are required to split the output signals $G_1$, $G_2$, and $G_3$. The first logic circuit receives signals $G_1$, $G_2$, and ENB, and therefore within the interval from $t_2$ to $t_3$ when all these three signals $G_1$, $G_2$, and ENB are at a high level, the first logic circuit generates the output signal $X_1$ of a high logic level. Similarly, the second logic circuit receives signals $G_2$, $G_3$, and ENB, and therefore within the interval from $t_3$ to $t_4$ when all these three signals $G_2$, $G_3$, and ENB are at a high level, the second logic circuit generates the output signal $X_2$ of a high logic level. As a result, non-overlapped output signals $X_1$ and $X_2$ are generated. Consequently, more non-overlapped output signals can be generated by utilizing the logic circuit 400.

However, each logic circuit requires a level shifter to shift the voltage level of the signal ENB from 3V to 8.5V. As more logic circuits are utilized, more level shifters are required. Unfortunately, additional level shifters result in increased power consumption.

SUMMARY OF THE INVENTION

Systems for displaying images are provided. In this regard, an exemplary embodiment of such a system comprises a dynamic shift register comprising a sampling unit, a holding unit, and a first logic circuit. The sampling unit, which is coupled to an incoming signal and a first input terminal of the dynamic shift register, samples the incoming signal according to a first input signal received by the first input terminal to generate a sampled value. The holding unit, which is coupled to the sampling unit, is utilized to hold the sampled value. The first logic circuit, which is coupled to the holding unit and an output terminal of the dynamic shift register, generates an output signal according to the sampled value and a second input signal inputted into the first logic circuit.

Another embodiment of such a system comprises a dynamic shift register comprising a sampling unit, a holding unit, and a first logic circuit. The sampling unit, which is coupled to an incoming signal and a first input terminal of the dynamic shift register, samples the incoming signal according to a first input signal received by the first input terminal to generate a sampled value. The sampling unit comprises at least a MOSFET having a gate controlled by the first input signal. The holding unit, which is coupled to the sampling unit, holds the sampled value, where the holding unit comprises a capacitor having a first terminal coupled to a voltage level and a second terminal coupled to the sampling unit. The first logic circuit, which is coupled to a second input terminal of the dynamic shift register, the holding unit and an output terminal of the dynamic shift register, allows a second input signal inputted into the second input terminal to adjust an output signal outputted at the output terminal when the sampled value held by the holding unit has a specific logic level.

Another embodiment of such a system comprises a vertical shift register circuit comprising a plurality of dynamic shift registers connected in a series. Each dynamic shift register comprises a sampling unit, a holding unit, and a first logic circuit. The sampling unit, which is coupled to an incoming signal and a first input terminal of the dynamic shift register, samples the incoming signal according to a first input signal received by the first input terminal to generate a sampled value. The holding unit, which is coupled to the sampling unit, is utilized to hold the sampled value, wherein the sampled value is outputted as a first output signal at a first output terminal. The first logic circuit, which is coupled to the holding unit and a second output terminal of the dynamic shift register, generates a second output signal according to the sampled value and a second input signal inputted into the first logic circuit, wherein, each dynamic shift register, except an initial dynamic shift register, receives the first output signal of a preceding dynamic shift register as the present incoming signal, and two adjacent dynamic shift registers receive two clock signals alternatively as the first input signal and the second input signal.

Consequently, the dynamic shift register disclosed in the present invention does not need an additional level shifter, implying that the power consumption, compared to the prior art, is effectively reduced. In addition, compared to the prior art, the implementation of the claimed dynamic shift register requires fewer transistors, reducing the production cost greatly.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
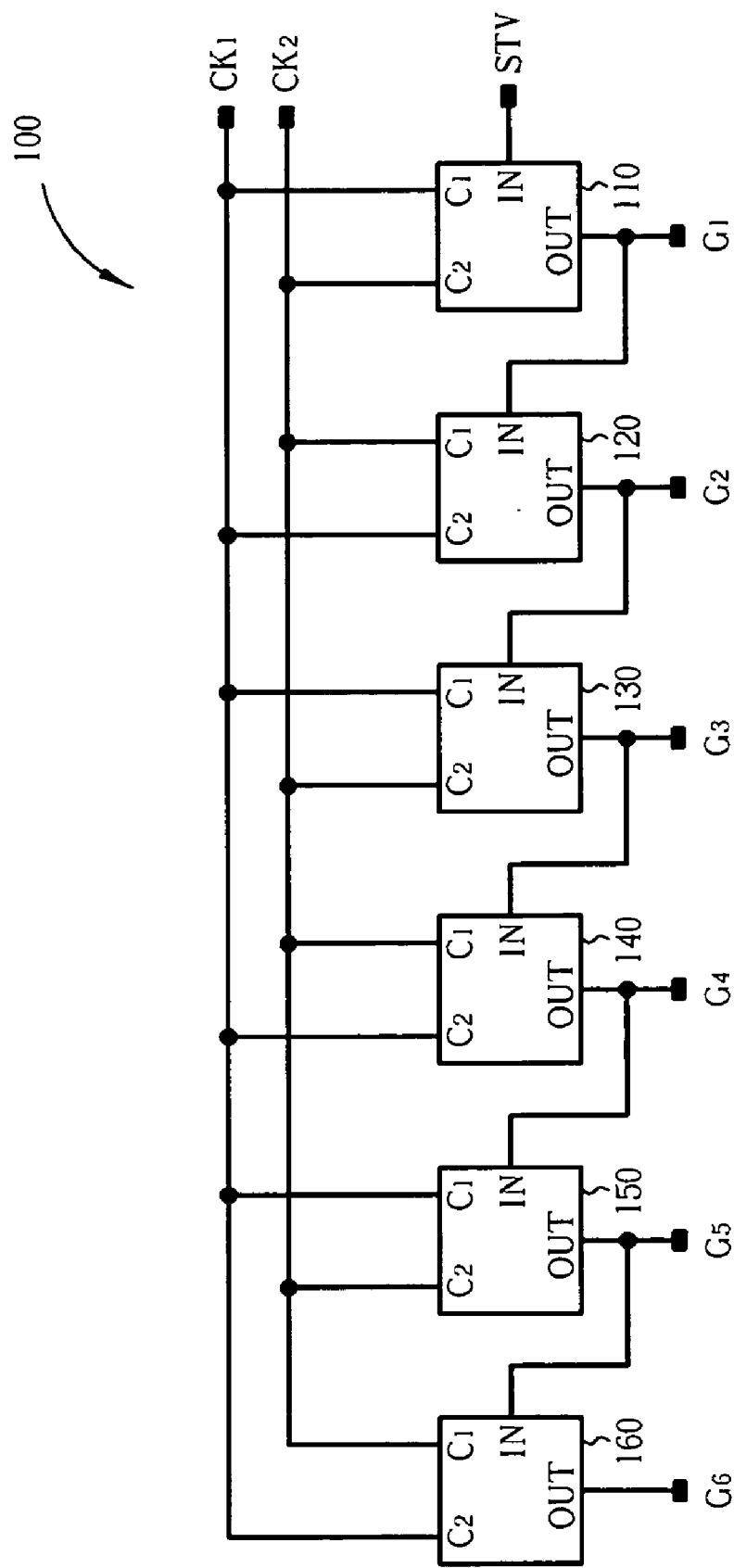
FIG. 1 shows a prior art shift register circuit.
Figure 2:
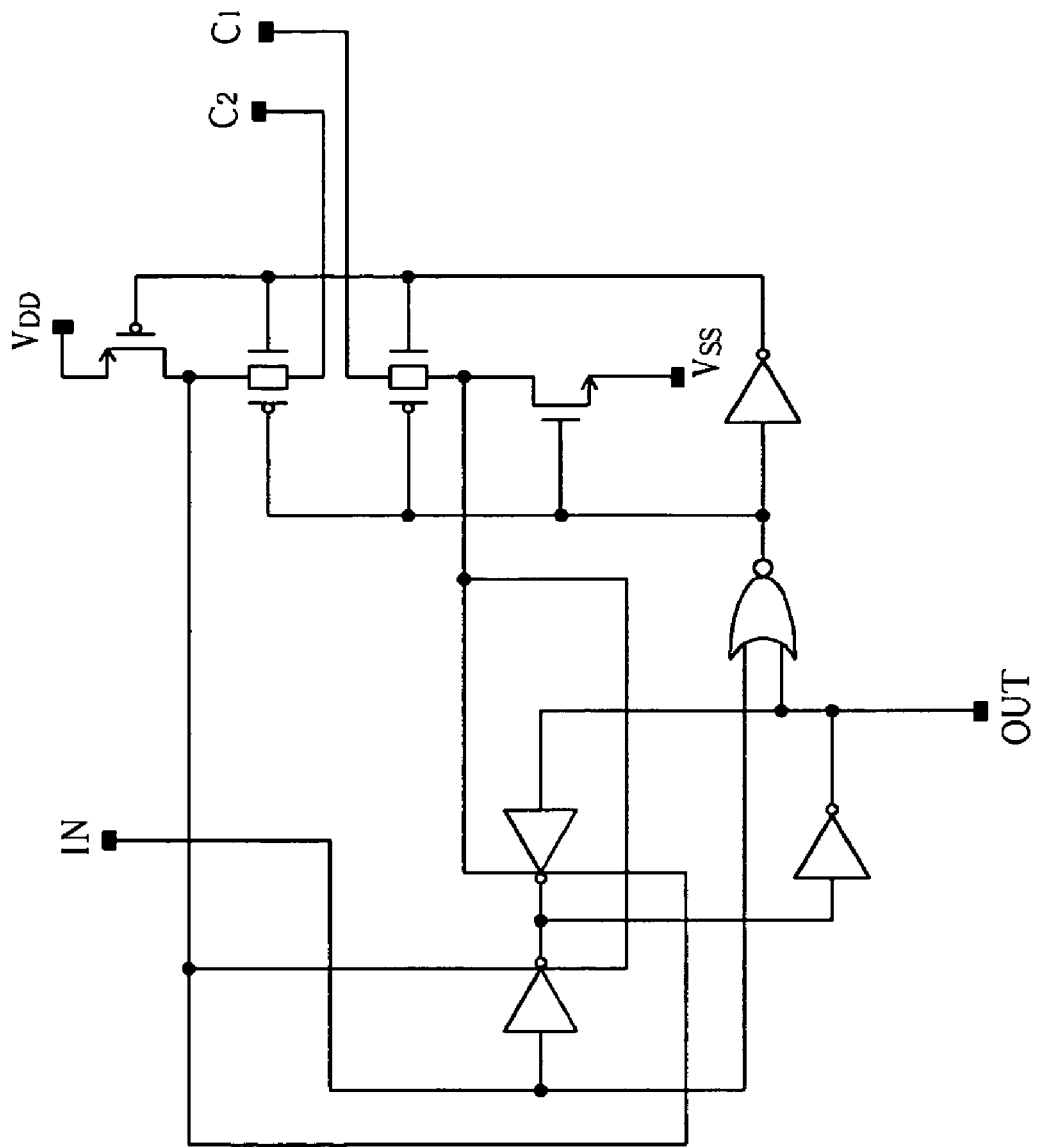
FIG. 2 shows the inner circuit of a dynamic shift register shown in FIG. 1.
Figure 3:
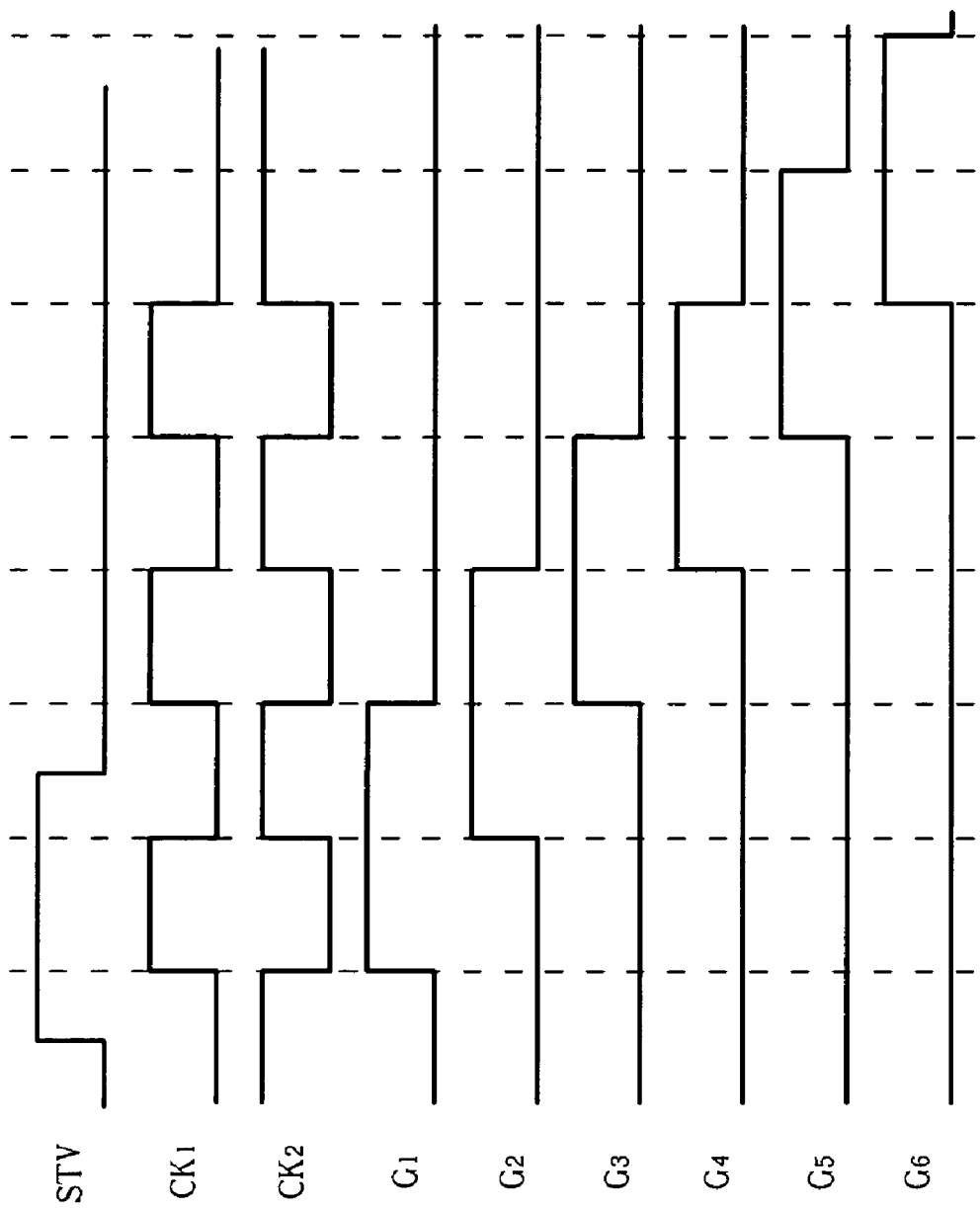
FIG. 3 shows the waveforms of the input signal STV, the two clock signals $CK_1$ and $CK_2$, and the output signals $G_1$ through $G_6$.
Figure 4:
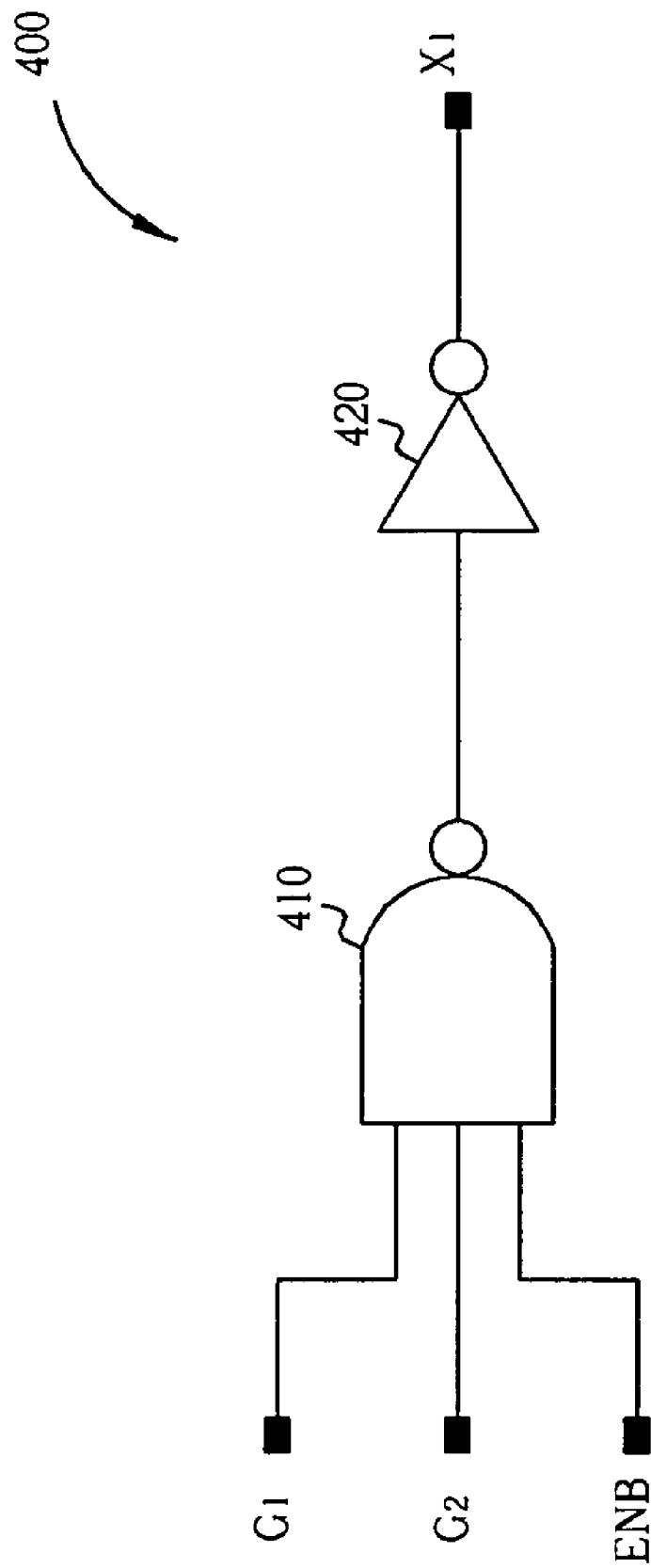
FIG. 4 shows a logic circuit utilized to split overlapped output signals generated by the shift register circuit shown in FIG. 1.
Figure 5:
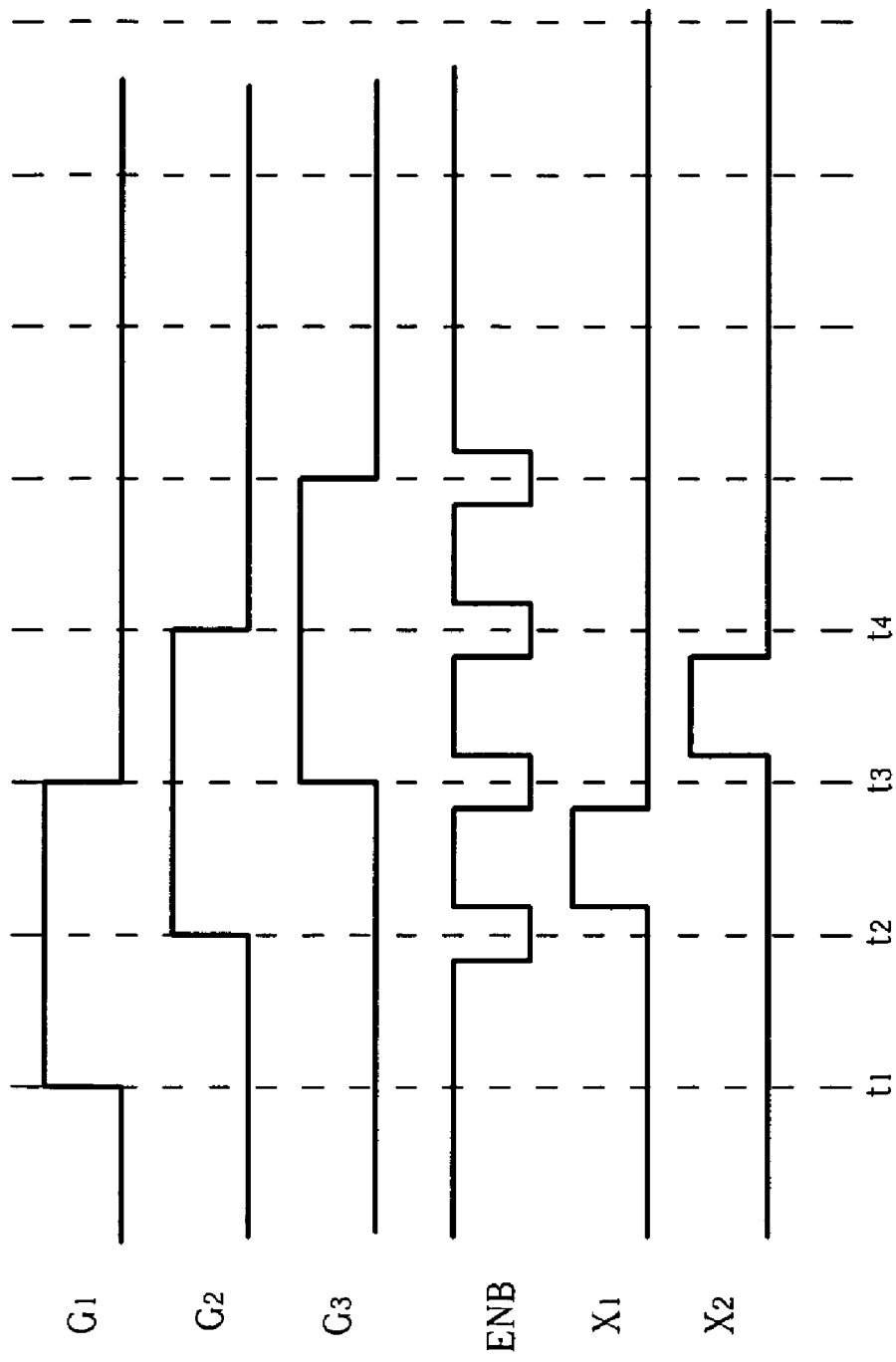
FIG. 5 shows the waveforms of three output signals $G_1$, $G_2$, and $G_3$ of the shift register circuit shown in FIG. 1, the signal ENB, and two split signals $X_1$ and $X_2$.
Figure 6:
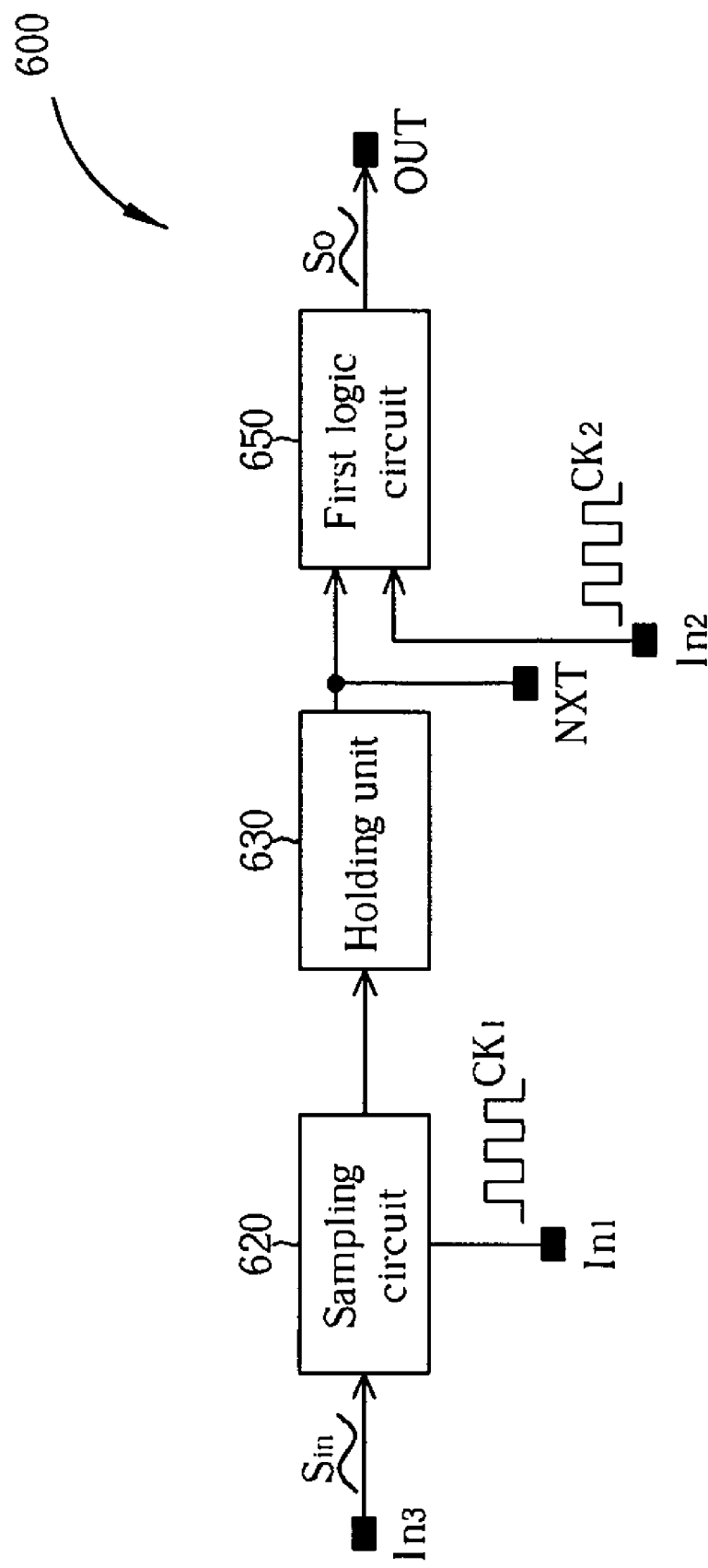
FIG. 6 is a block diagram illustrating a dynamic shift register according to a first embodiment of the present invention.

Please refer to FIG. 6. FIG. 6 is a block diagram illustrating a dynamic shift register 600 according to a first embodiment of the present invention. As shown in FIG. 6, the dynamic shift register 600 includes a sampling circuit 620, a holding unit 630, and a first logic circuit 650. In this embodiment, the sampling circuit 620 samples an incoming signal $S_{in}$ inputted at an input terminal $In_2$ according to a clock signal $CK_1$ received from an input terminal $In_1$; the holding unit 630 then holds the sampled value, generated from the preceding sampling circuit; and the first logic circuit 650 finally outputs an output signals $S_o$ to an output terminal OUT by referencing the held sampled value and a clock signal $CK_2$ inputted at an input terminal $In_2$. Please note, an additional output terminal NXT coupled to the output of the holding circuit 630 is created in the dynamic shift register 600 for further utilization, which is detailed later.

Figure 7:
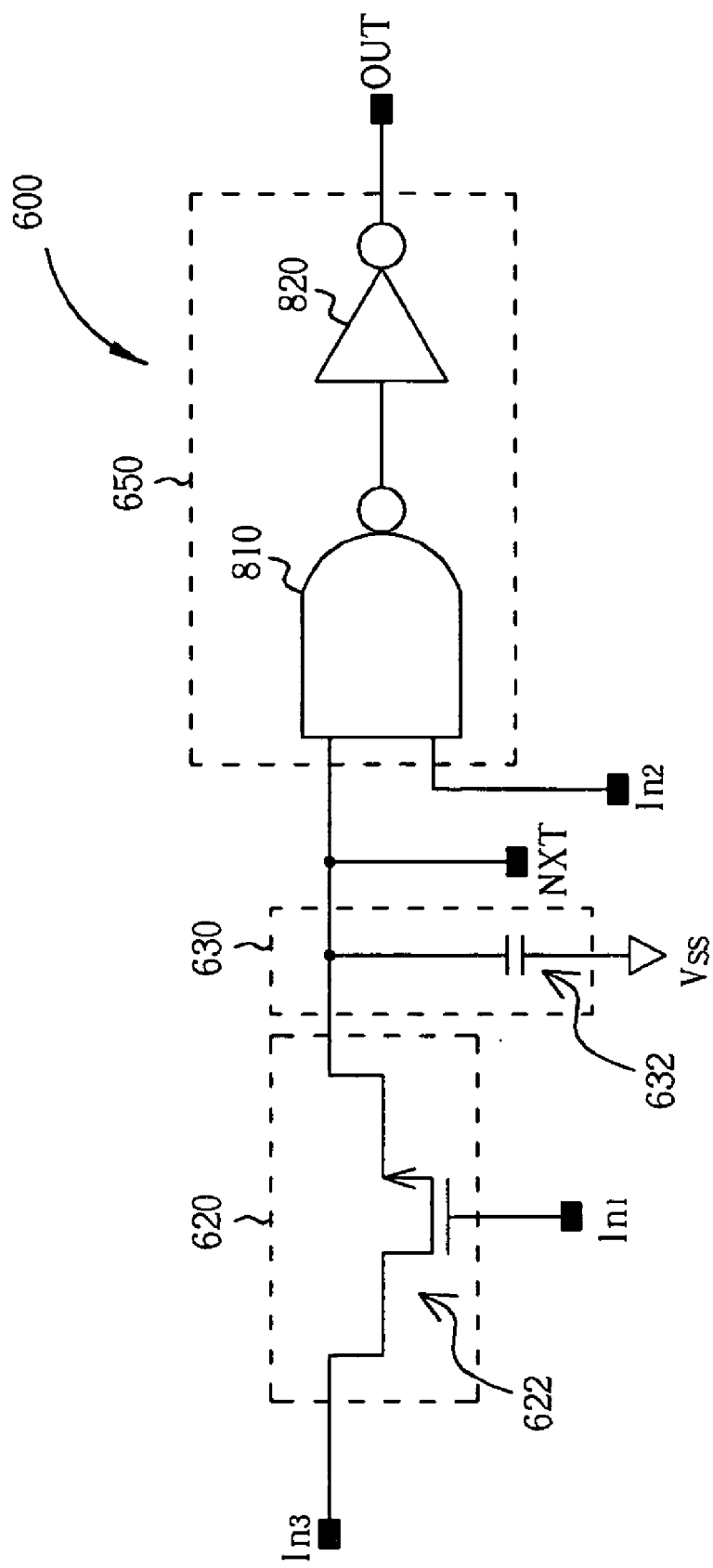
FIG. 7 is a circuit diagram illustrating a first embodiment of the dynamic shift register shown in FIG. 6.

Please refer to FIG. 7. FIG. 7 is a circuit diagram illustrating a first embodiment of the dynamic shift register 600 shown in FIG. 6. As one can see, the sampling unit 620 is implemented by a MOSFET 622 that receives the incoming signal $S_{in}$ at the drain terminal, and receives the clock signal $CK_1$ at the gate terminal, which is also the input terminal $In_1$ of the dynamic shift register 600. The sampling unit 620 acts as a switch that utilizes the clock signal $CK_1$ as a sampling clock to sample the incoming signal $S_{in}$. In this embodiment, the sampling unit 620 is implemented by an N-MOSFET, so when the clock signal $CK_1$ is at a high voltage level, the MOSFET 622 turns on, allowing the incoming signal $S_{in}$ to pass through thus being a sampled value transmitted to the following holding unit 630. In this embodiment, the holding unit 630 is implemented by a capacitor 632 having a terminal coupled to the voltage level $V_{ss}$ and another terminal coupled to the source terminal of the MOSFET 622. When the sampled value, which represents the voltage level of the incoming signal $S_{in}$, is generated by the MOSFET 622 at its source terminal, the capacitor 632 will be charged or discharged and therefore the voltage level will be held to the sampled value. Afterward, the held voltage level, i.e., the sampled value, is received by the following first logic circuit 650. In this embodiment, the first logic circuit 650 includes a NAND gate 810, which receives the held voltage level and the clock signal $CK_2$ at the input terminal $In_2$, and an inverter 820, which is coupled to the output terminal OUT.

Figure 8:
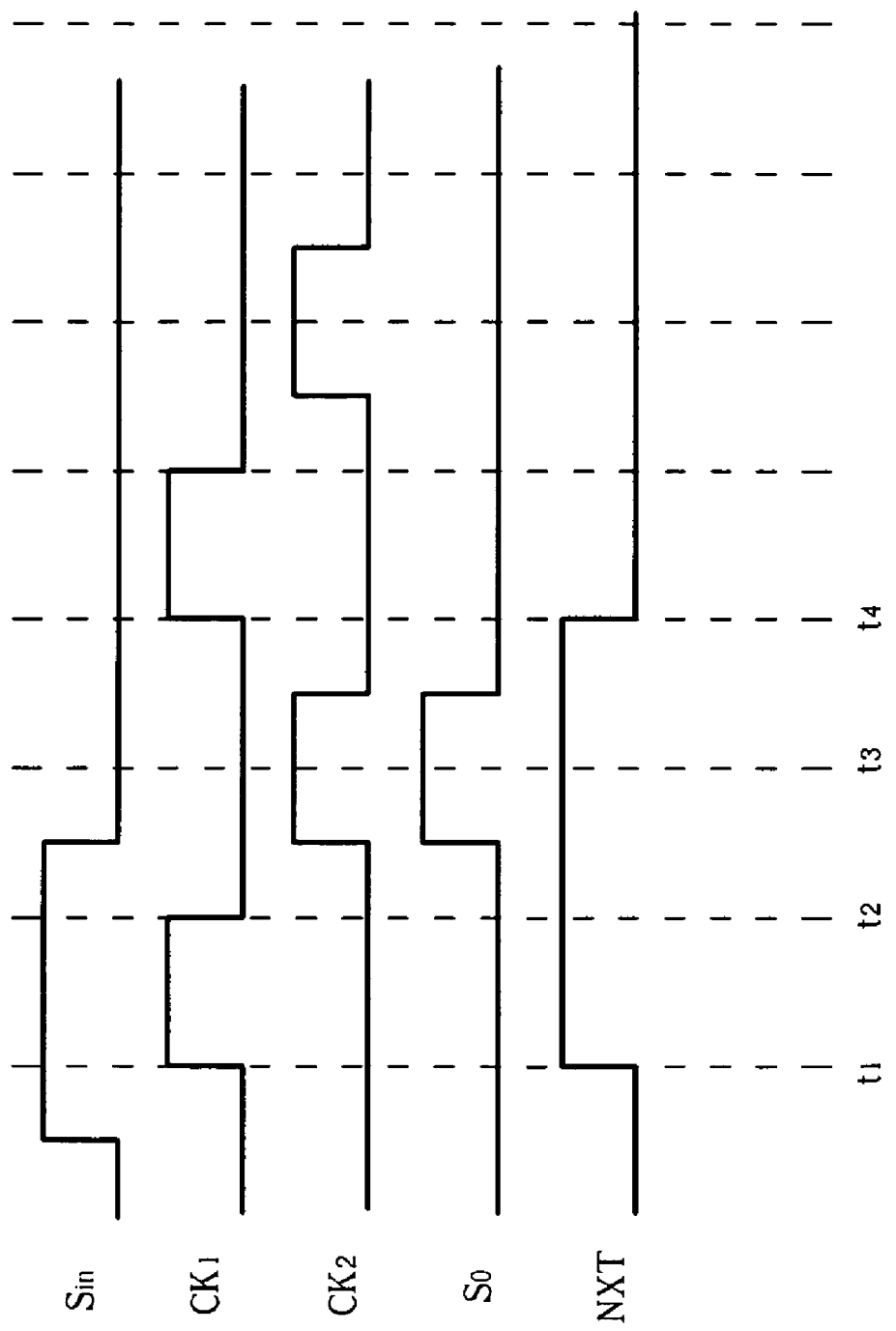
FIG. 8 shows the waveforms of the incoming signal $S_{in}$, the clock signals $CK_1$ and $CK_2$, and the output signals $S_o$ and NXT.

Please refer to FIG. 7 in conjunction with FIG. 8. FIG. 8 shows the waveforms of the incoming signal $S_{in}$, the clock signals $CK_1$ and $CK_2$, and the output signals $S_o$ and NXT. During the interval from $t_1$ to $t_2$, the clock signal $CK_1$ that controls the sampling unit 620 is at a high level such that the MOSFET 622 turns on, allowing the incoming signal $S_{in}$, which is also at a high level during the interval from $t_1$ to $t_2$, to pass to the following stage. During the interval from $t_1$ to $t_2$, the holding unit 630, i.e. the capacitor 632, is continuously being charged. Hence, after the MOSFET 622 turns off at time $t_2$, the capacitor 632 is ideally fully charged by the incoming signal $S_{in}$, and the voltage level will be maintained at a high level by the holding unit 630 during the interval from $t_2$ to $t_4$ when the clock signal $CK_1$ is at a low level such that the MOSFET 622 will remain off. Then, the first logic circuit 650 receives the high level from the preceding stage (i.e., the holding circuit 630) and the clock signal $CK_2$. During the interval from $t_2$ to $t_4$, the clock signal $CK_2$ has a high level duration. The waveform of the output signal at the output terminal NXT is also in FIG. 7. The output signal NXT transits from low to high at time $t_1$ when the sampling unit 620 samples a high level of the incoming signal $S_{in}$. Afterward, the output signal NXT is kept at a high level by the holding unit 630 until the sampling unit 620 performs its next sample at time $t_4$. As one can see, the combination of the NAND gate 810 and the inverter 820 acts as an AND gate. Therefore, it is apparent that only when the held voltage level and the clock signal $CK_2$ are both at a high level, will the output signal $S_o$ also be at a high level. As a result, the output signal $S_o$ has a high level duration that matches the high level duration of the clock signal $CK_2$ during the interval from $t_2$ to $t_4$.

Figure 9:
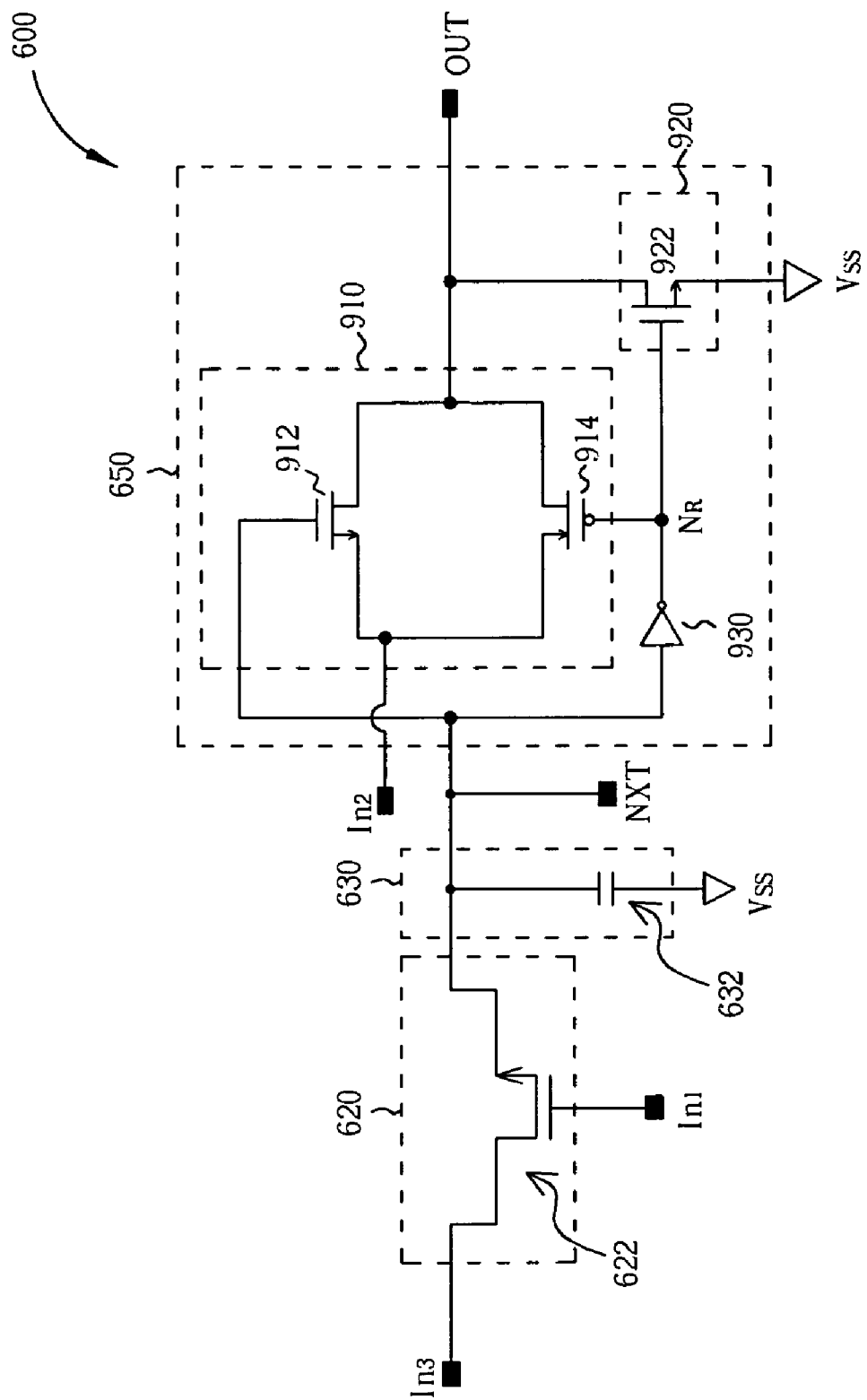
FIG. 9 is a circuit diagram illustrating a second embodiment of the dynamic shift register shown in FIG. 6.

Please refer to FIG. 9. FIG. 9 is a circuit diagram illustrating a second embodiment of the dynamic shift register 600 shown in FIG. 6. The circuitry shown in FIG. 9 is similar to that shown in FIG. 7. The major difference is the configuration of the first logic circuit 650. In this embodiment, the first logic circuit 650 includes a first switching circuit 910, a second switching circuit 920, and an inverter 930. The first switching circuit 910 comprises an N-MOSFET 912 and a P-MOSFET 914, which are connected in parallel and both receiving the clock signal $CK_2$ at the source terminal and generating an output signal at the drain terminal. The second switching circuit 920 is implemented by an N-MOSFET 922. Both the first switching circuit 910 and the second switching circuit 920 are controlled by the voltage level held by the holding circuit 630. More specifically, when the held voltage level is at a high level, the voltage level at the node $N_R$ will be opposite to the high level, i.e., a low level, due to the inverter 930. This causes the N-MOSFET 912 and the P-MOSFET 914 to turn on and the N-MOSFET 922 to turn off, allowing the clock signal $CK_2$ at the input terminal $In_2$ to pass to the output terminal. Alternatively, when the held voltage level is at a low level, the voltage level at the node $N_R$ will be at a high level due to the inverter 930. This causes the N-MOSFET 912 and the P-MOSFET 914 to turn off and the N-MOSFET 922 to turn on, allowing the low voltage level $V_{ss}$ to pass to the output terminal. Thus, referring back to FIG. 8, during the interval from $t_2$ to $t_4$, when the held voltage level is a high level, the first switching circuit 910 turns on, allowing the clock signal $CK_2$ to pass to the output terminal. As a result, the output signal $S_o$ has a high level duration that matches the high level duration of the clock signal $CK_2$ during the interval from $t_2$ to $t_4$.

Figure 10:
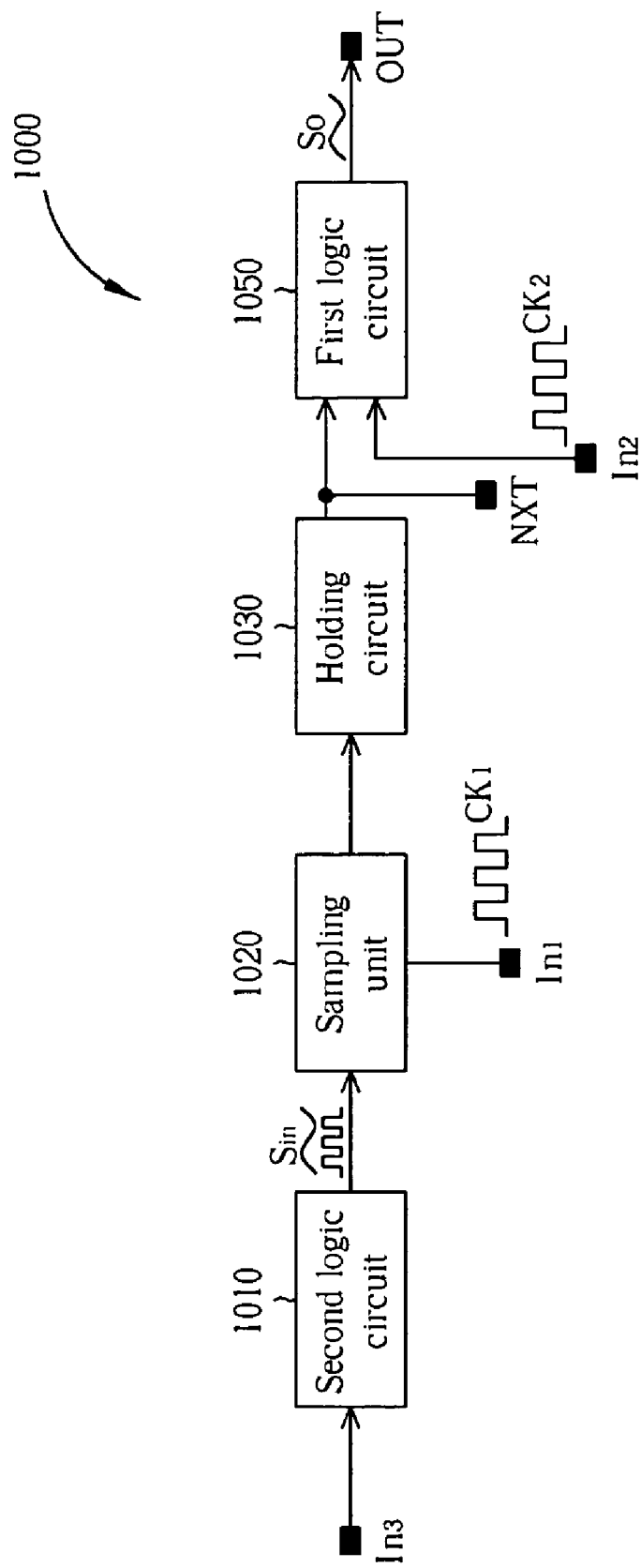
FIG. 10 is a block diagram illustrating a dynamic shift register according to a second embodiment of the present invention.

In some circumstances, the voltage level of the incoming signal $S_{in}$ may not be very accurate, i.e., the incoming signal $S_{in}$ may not be either at an absolute high level (i.e., '1') or an absolute low level (i.e., '0'). Hence an additional logic circuit is needed to shift the level of the incoming signal. Please refer to FIG. 10. FIG. 10 is a block diagram illustrating a dynamic shift register 1000 according to a second embodiment of the present invention. As shown in FIG. 10, the dynamic shift register 100 includes a second logic circuit 1010, a sampling circuit 1020, a holding unit 1030, and a first logic circuit 1050. The dynamic shift register 1000 is similar to the dynamic shift register 600 shown in FIG. 6 therein, however, the dynamic shift register 1000 has an additional logic circuit (i.e., the second logic circuit 1010) to shift the level of the input signal at an input terminal $In_3$ to generate the incoming signal $S_{in}$. The sampling circuit 1020 then samples the received incoming signal $S_{in}$ according to the clock signal $CK_1$ received from the input terminal $In_1$. The holding unit 1030 is utilized to hold the sampled value, generated from the preceding sampling circuit 1020. The first logic circuit 1050 is utilized to output the output signals $S_o$ to an output terminal OUT by referencing the sampled value held by the holding circuit 1030 and the clock signal $CK_2$ inputted at the input terminal $In_2$. Similarly, the additional output terminal NXT coupled to the output of the holding circuit 1030 is created in the dynamic shift register 1000 for further utilization, which is detailed later.

Figure 11:
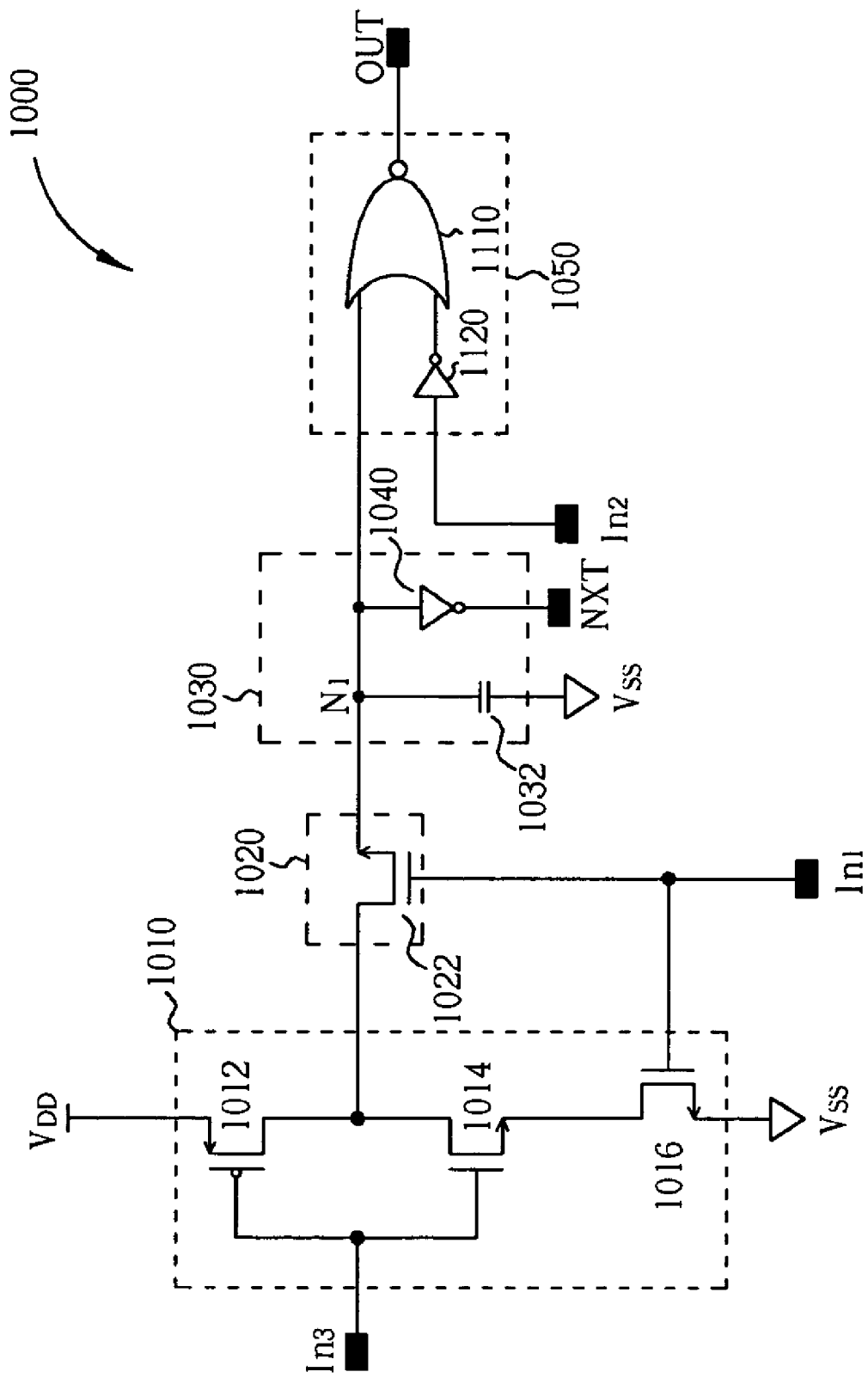
FIG. 11 is a circuit diagram illustrating a first embodiment of the dynamic shift register shown in FIG. 10.

Please refer to FIG. 11. FIG. 11 is a circuit diagram illustrating a first embodiment of the dynamic shift register 1000 shown in FIG. 10. As shown in FIG. 10, it is well known to those skilled in the art that the combination of a P-MOSFET 1012 and an N-MOSFET 1014 serves as an inverter. The input signal received at the input terminal $In_3$ of the dynamic shift register 1000 is turned into the incoming signal $S_{in}$, which is by way of the logic circuit 1010 now of digital form. Therefore, the incoming signal $S_{in}$ to be processed by the sampling circuit 1020 is either at an absolute high level equal to the voltage level $V_{DD}$ or at an absolute low level equal to the voltage level $V_{ss}$. Moreover, there is an N-MOSFET 1016 connected in series with the N-MOSFET 1014, and acts as an enabling controller. As one can see, the sampling circuit 1020 is implemented by an N-MOSFET 1022, and gates of the N-MOSFETs 1020 and 1022 are both coupled to the input terminal $In_1$, implying that the N-MOSFET 1020 is turned on only when the sampling circuit 1020 is sampling data. If the N-MOSFET 1016 is turned off, the inverter consisting of the P-MOSFET 1012 and the N-MOSFET 1014 can't operate like a normal inverter. In other words, the inverter function is disabled when the sampling circuit 1020 is not sampling data.

Because the above-mentioned inverter will invert the logic levels of the input signal, adequate circuit configuration is needed to meet the signal requirements. As one can see, in addition to the capacitor 1032, an inverter 1040 is included in the holding circuit 1030 to guarantee that the output at terminal NXT is correct for further utilization. As to the first logic circuit 1050 in this embodiment, it includes a NOR gate 1110 and an inverter 1120. It is apparent that only when the voltage level held by the holding circuit 1030 is at a low level and meanwhile the clock signal $CK_2$ is at a high level, will the output signal $S_o$ be at a high level. A low level held by the holding circuit 1030 implies that the input signal received at the input terminal $In_3$ is at a high level when the sampling unit 620 is sampling. As a result, the waveforms corresponding to the circuit shown in FIG. 11 are the same as those shown in FIG. 8 with the shown input signal $S_{in}$ representing the input signal received at the input terminal $In_3$ instead.

Figure 12:
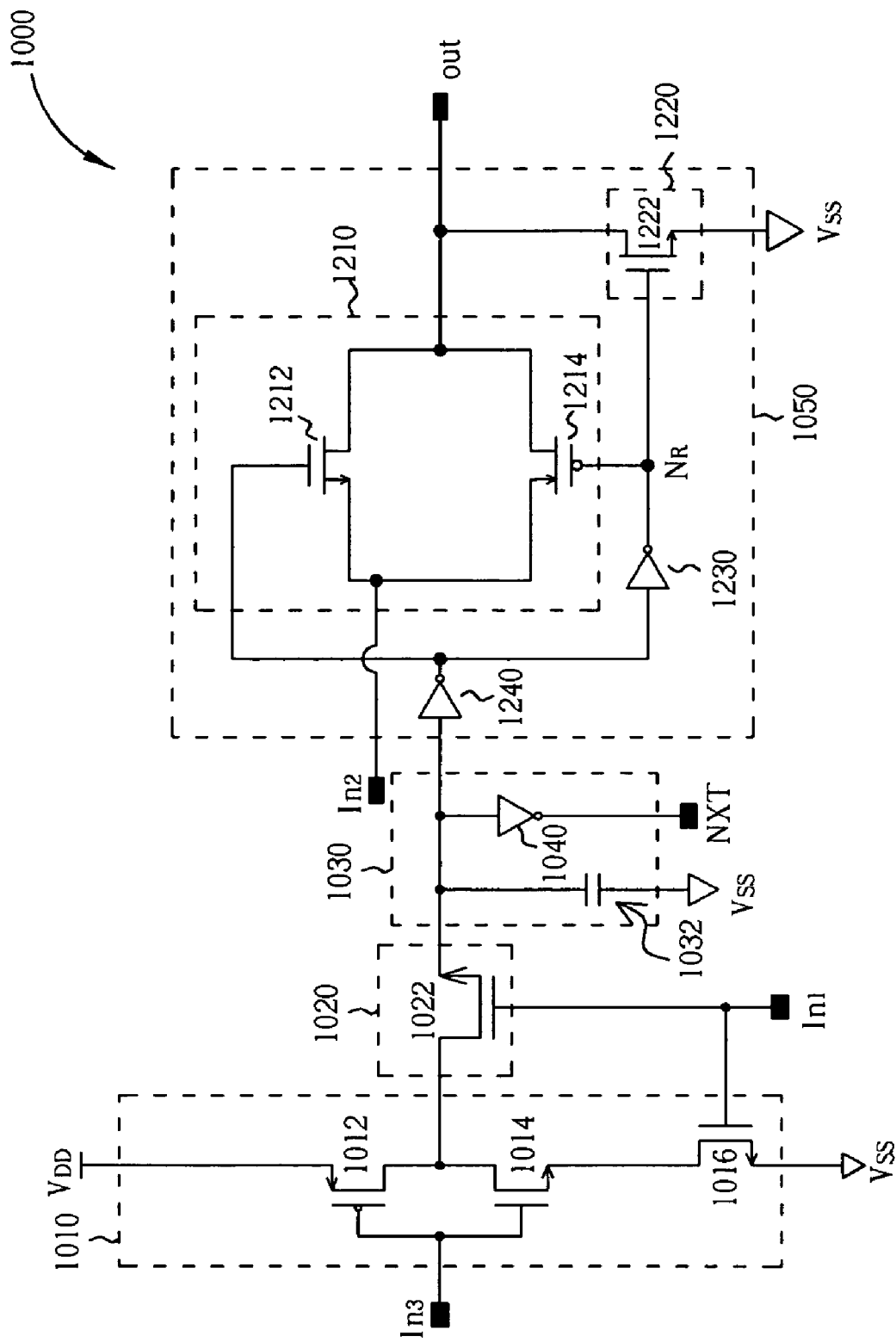
FIG. 12 is a circuit diagram illustrating a second embodiment of the dynamic shift register shown in FIG. 10.

Please refer to FIG. 12. FIG. 12 is a circuit diagram illustrating a second embodiment of the dynamic shift register 1000 shown in FIG. 10. The circuitry shown in FIG. 12 is similar to that shown in FIG. 11. The major difference is the confirmation of the first logic circuit 1050. In this embodiment, the first logic circuit 1050 includes a first switching circuit 1210, a second switching circuit 1220, and a plurality of inverters 1230 and 1240. The first switching circuit 1210 comprises an N-MOSFET 1212 and a P-MOSFET 1214, which are connected in parallel and both receiving the clock signal $CK_2$ at the source terminal and generating an output signal at the drain terminal. The second switching circuit 1220 is implemented by an N-MOSFET 1222. Both the first switching circuit 1210 and the second switching circuit 1220 are controlled by the voltage level held by the holding circuit 1030 via the inverters 1230 and 1240. More specifically, when the held voltage level is at a low level (i.e., the corresponding voltage level of the input signal received at the input terminal $In_3$ represents logic high), the voltage level at the node $N_R$ will be the low level due to the inverters 1230 and 1240. This causes the N-MOSFET 1212 and the P-MOSFET 1214 to turn on and the N-MOSFET 1222 to turn off, allowing the clock signal $CK_2$ at the input terminal $In_2$ to pass to the output terminal OUT. Alternatively, when the held voltage level is at a high level (i.e., the corresponding voltage level of the input signal received at the input terminal $In_3$ represents logic low), the voltage level at the node $N_R$ will be at a high level due to the inverters 1230 and 1040. This causes the N-MOSFET 1212 and the P-MOSFET 1214 to turn off and the N-MOSFET 1222 to turn on, allowing the low voltage level $V_{ss}$ to pass to the output terminal OUT. Thus, in this embodiment the output signal $S_o$ in response to the input signal received at the input terminal $In_3$ is identical to that shown FIG. 8. The same objective of obtaining the desired output signal $S_o$ at the output terminal OUT is achieved.

Figure 13:
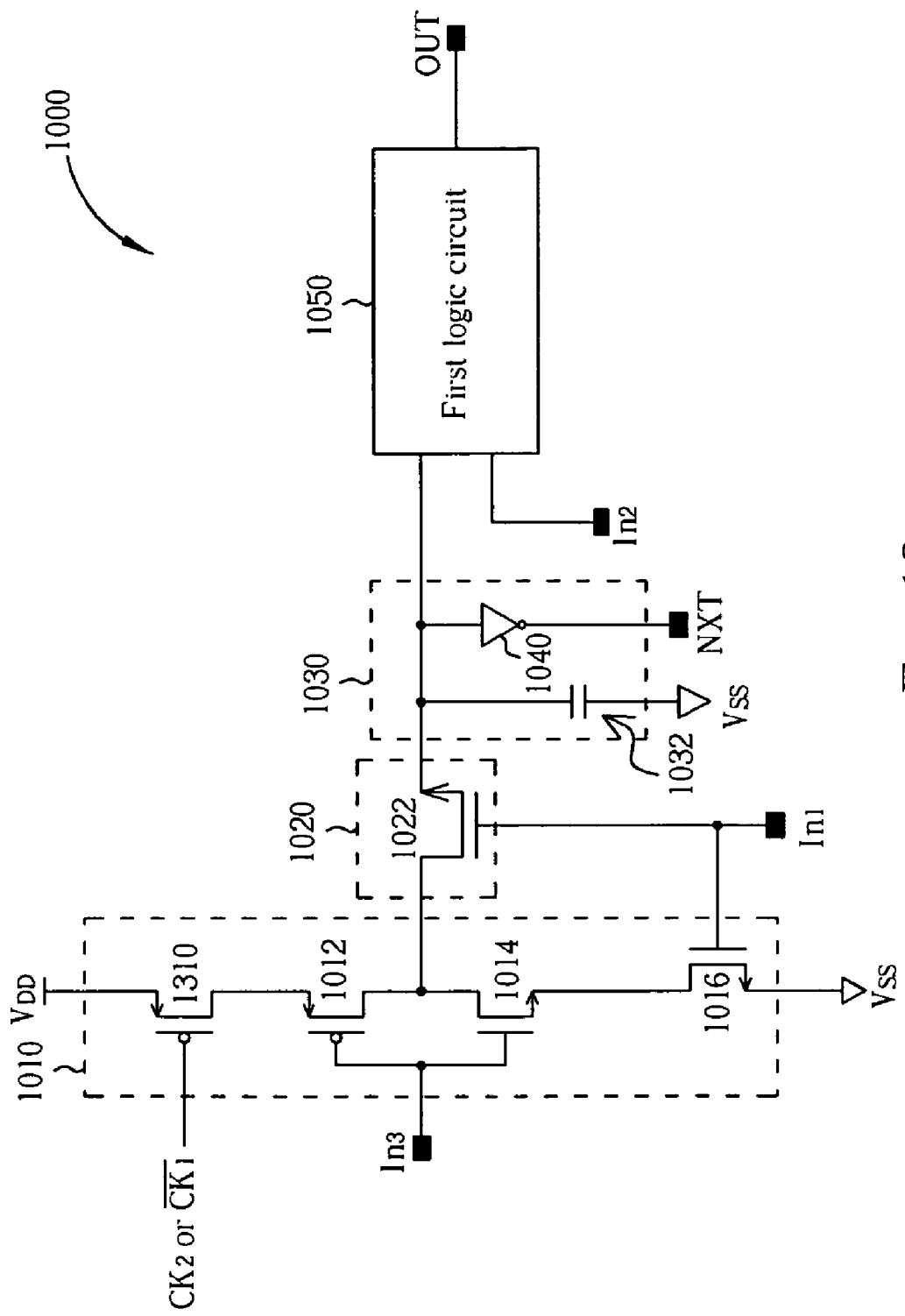
FIG. 13 is a circuit diagram illustrating a third embodiment of the dynamic shift register shown in FIG. 10.

However, the confirmation of the second logic circuit 1010 shown in FIG. 11 or FIG. 12 has an inherent leakage problem caused by the P-MOSFET 1012. Referring to FIG. 8, the clock signal $CK_1$ has a transition from a high level to a low level at $t_2$, turning off the N-MOSFET 1016 in conjunction with the N-MOSFET 1022. However, the input signal at the input terminal $In_3$, having the waveform as that of the input signal $S_{in}$ shown in FIG. 8, has a transition from a high level to a low level at $t_3$. In addition, the input clock CK2 has a transition from a low level to a high level at the same time (i.e., $t_3$) to make the output signal $S_o$ has an identical transition since the voltage level held by the holding circuit 1030 is at a low level. However, the low level at the input terminal $In_3$ will make the P-MOSFET 1012 enable a leakage path that might affect the currently held voltage level (i.e., a low level) in the holding circuit 1030. In a worst case, erroneous output signal is outputted from the output terminal OUT due to the undesired leakage current. To solve this problem, the present invention provides a modified second logic circuit. Please refer to FIG. 13. FIG. 13 is a circuit diagram illustrating a third embodiment of the dynamic shift register 1000 shown in FIG. 10. In this embodiment, the first logic circuit 1050 can be implemented by the circuit configuration shown in either FIG. 11 or FIG. 12. As shown in FIG. 13, a P-MOSFET 1310 is added to the second logic circuit 1010. The gate of the P-MOSFET 1310 is coupled to either the clock signal $CK_2$ or an inverted signal of the input clock $CK_1$. Please note that the aforementioned alternative designs fall in the scope of the present invention. As one can see, it is guaranteed that the P-MOSFET 1310 is turned off to cut off the aforementioned leakage path when the first logic circuit 1050 references the clock signal $CK_2$ to generate the output signal. Therefore, in this embodiment the voltage level held by the holding circuit 1030 is affected by the leakage current no more.

Figure 14:
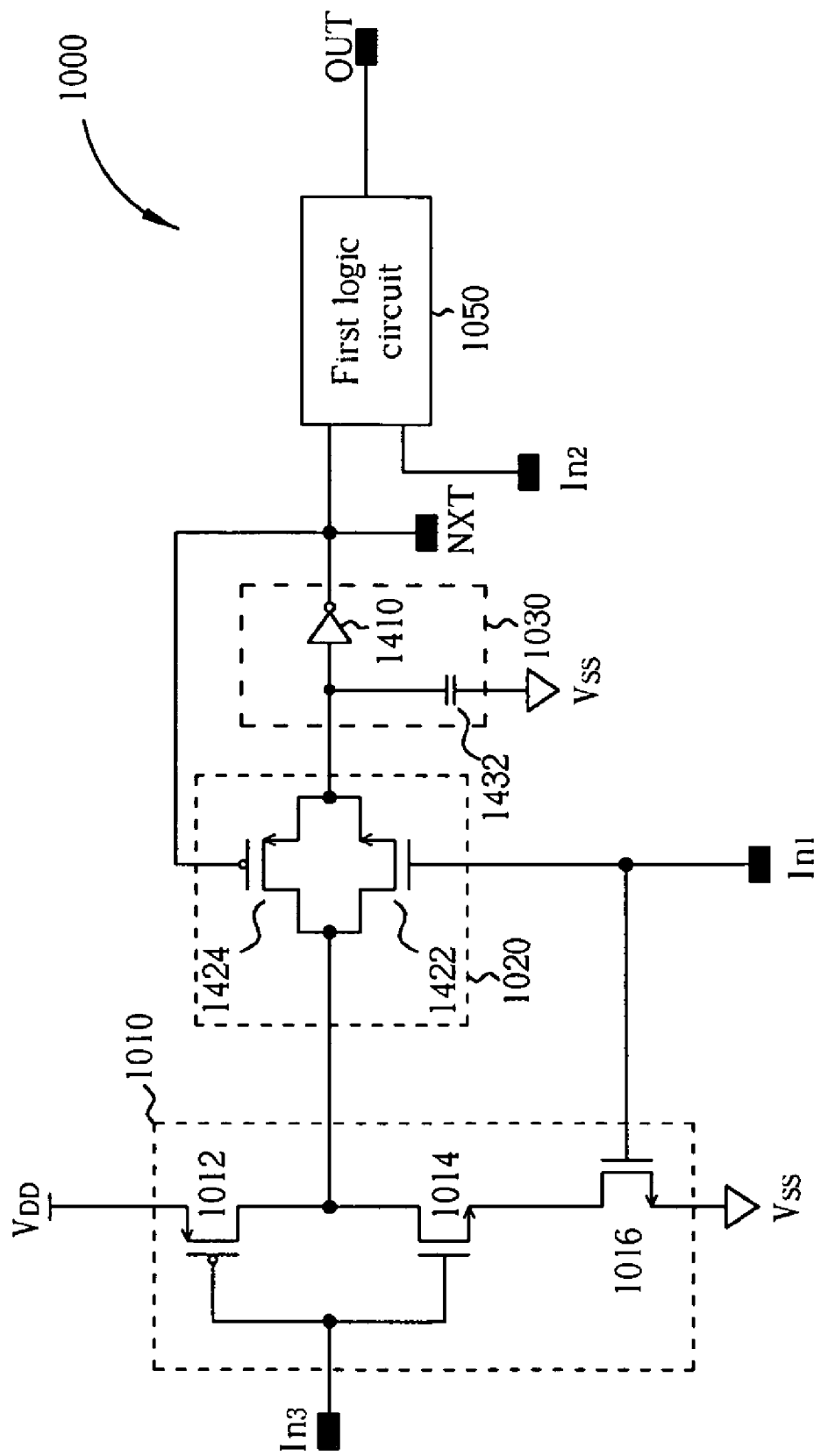
FIG. 14 is a circuit diagram illustrating a fourth embodiment of the dynamic shift register shown in FIG. 10.
Figure 20:
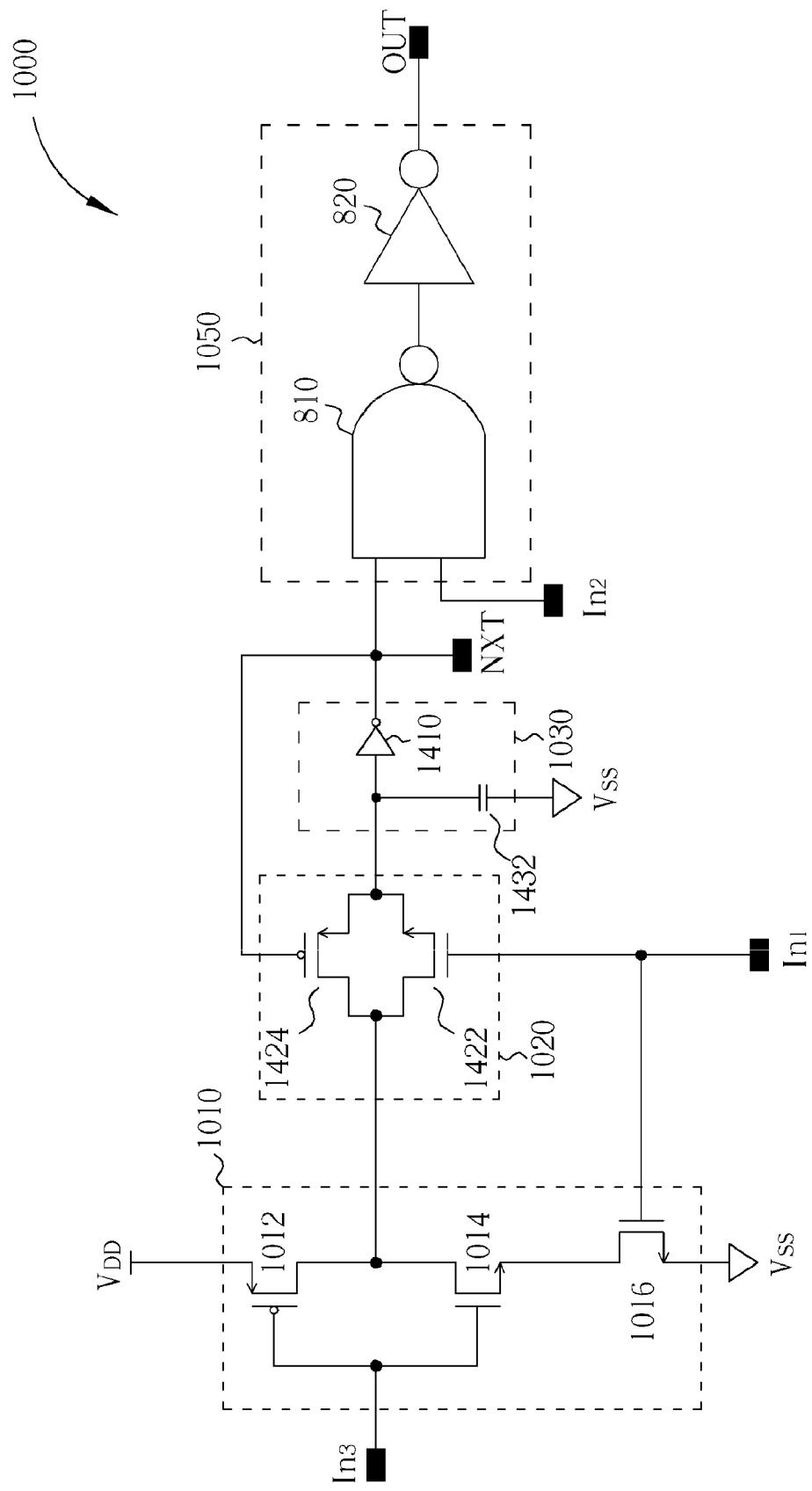
FIG. 20 is a circuit diagram illustrating a sixth embodiment of the dynamic shift register shown in FIG. 10.
Figure 21:
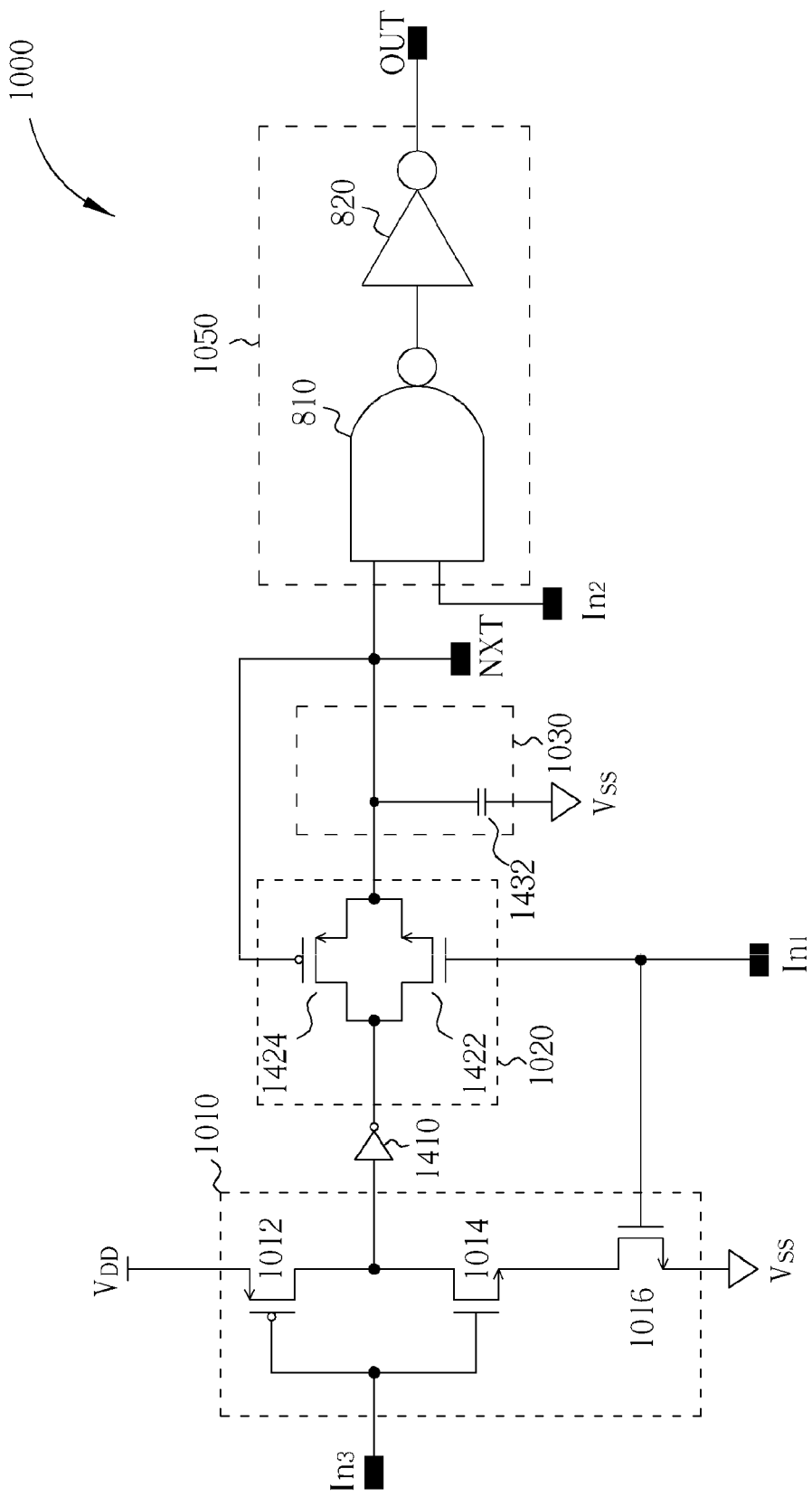
FIG. 21 is a circuit diagram illustrating a seventh embodiment of the dynamic shift register shown in FIG. 10.

To still applied the circuit configuration of the first logic circuit 650 shown in FIG. 7 or FIG. 9 to the first logic circuit 1050 shown in FIG. 10, an additional inverter is needed for adjusting the final voltage level outputted from the holding circuit 1030. Please refer to FIG. 14. FIG. 14 is a circuit diagram illustrating a fourth embodiment of the dynamic shift register 1000 shown in FIG. 10. In this embodiment, the first logic circuit 1050 can be implemented by the circuit configuration of the first logic circuit 650 shown in either FIG. 7 or FIG. 9, which can also be represented by the circuit shown in FIG. 20. In addition, the holding circuit 1030 includes a capacitor 1432 and an inverter 1410. In this embodiment, the inverter 1410 is connected between the first logic circuit 1050 and the sampling unit 1020; however, it is only meant to be an example, and is not meant to be taken as limitations of the present invention. For example, in other embodiments, the inverter 1410 is connected between the second logic circuit 1010 and the sampling circuit 1020, and can be integrated into either the second logic circuit 1010 or the sampling circuit 1020, which can also be represent by the circuit in FIG. 21.

As shown in FIG. 14, the voltage level held by capacitor 1432 is inverted by the inverter 1410 before inputted to the first logic circuit 1050. Therefore, we can adopt the first logic circuit 650 shown in FIG. 7 or the first logic circuit 650 shown in FIG. 9 as the desired first logic circuit 1050 by using the output of the inverter 1410 as an input of the first logic circuit 650 shown in FIG. 7 or in FIG. 9. Moreover, in the dynamic shift register 1000 shown in FIG. 14 a modified sampling circuit 1020 is presented. Being different from the sampling units mentioned above, the sampling unit 1020 comprises an N-MOSFET 1422 and a P-MOSFET 1424, which are connected in parallel. When the sampling unit 1020 samples a high level incoming signal $S_{in}$ outputted from the second logic circuit 1010, the voltage level at the output of the inverter 1410, which is opposite to the incoming signal $S_{in}$, will turn on the P-MOSFET 1224. As a result, the high level incoming signal $S_{in}$ will pass through the P-MOSFET 1224 to the following holding circuit 1030, and a voltage drop caused by the N-MOSFET 1422 will therefore be compensated by the P-MOSFET 1224. It should be noted that the transmission gate established by a P-MOSFET and an N-MOSFET can also be applied to previously stated embodiments to prevent undesired voltage drop. For example, with adequate modifications made to the circuitry shown in FIG. 11, the N-MOSFET 1022 can be replaced with the transmission gate. Since these modifications are well-known to those skilled in this art, further description is omitted for brevity. These alternative designs fall in the scope of the present invention.

Figure 15:
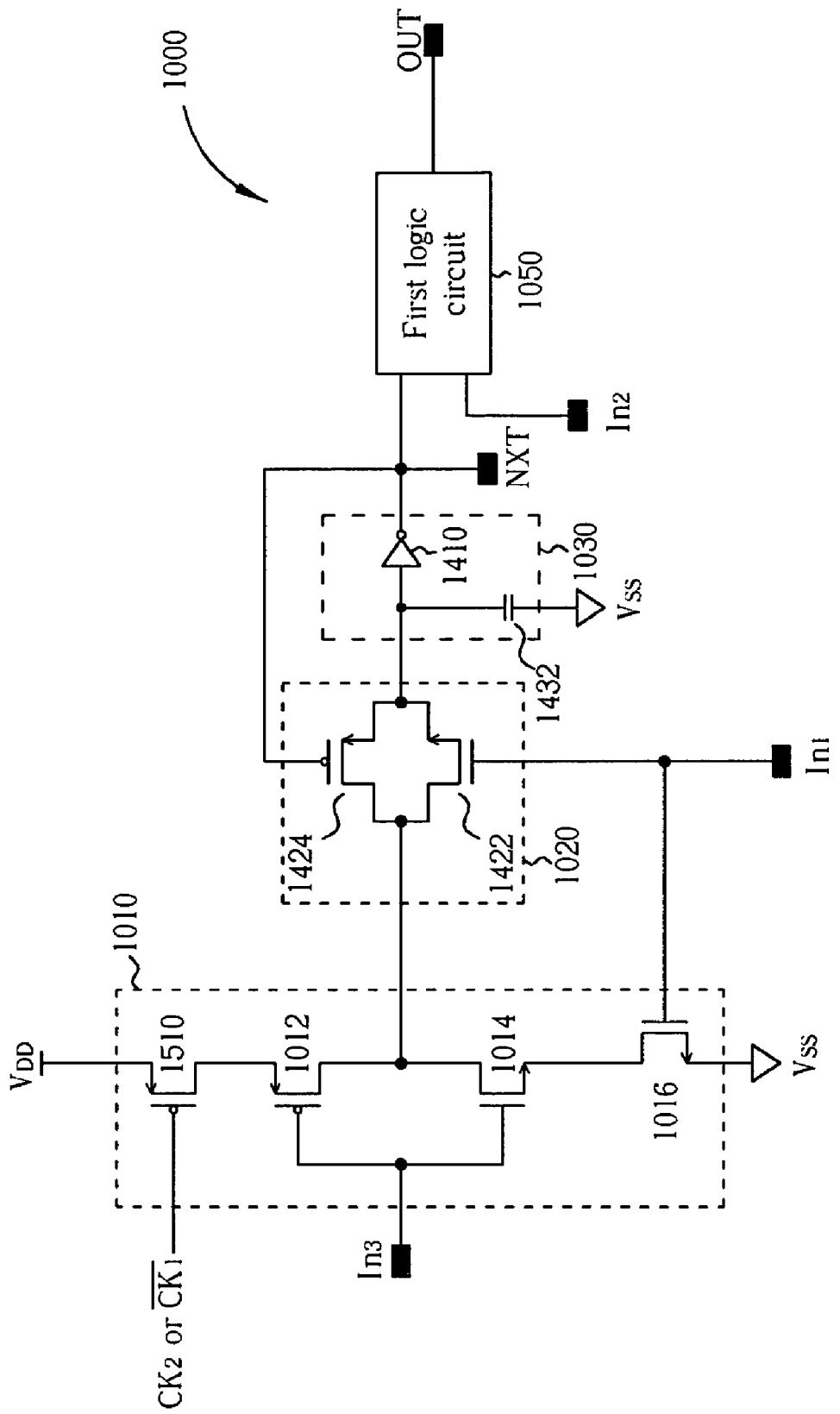
FIG. 15 is a circuit diagram illustrating a fifth embodiment of the dynamic shift register shown in FIG. 10.

As mentioned above, the dynamic shift register 1000 shown in FIG. 14 will suffer from the leakage problem caused by the circuit configuration of the second logic circuit 1010. Therefore, an improved second logic circuit 1010 can be applied to the dynamic shift register 1000 shown in FIG. 14 to solve this problem. Please refer to FIG. 15. FIG. 15 is a circuit diagram illustrating a fifth embodiment of the dynamic shift register 1000 shown in FIG. 10. The circuitry shown in FIG. 15 is similar to that shown in FIG. 14. The major difference is that a P-MOSFET 1510 is added to the second logic circuit 1010 to protect the voltage level held by the holding circuit 1030 from being influenced by the undesired leakage current. Since the protection mechanism has been detailed above, further description is omitted for brevity.

Figure 16:
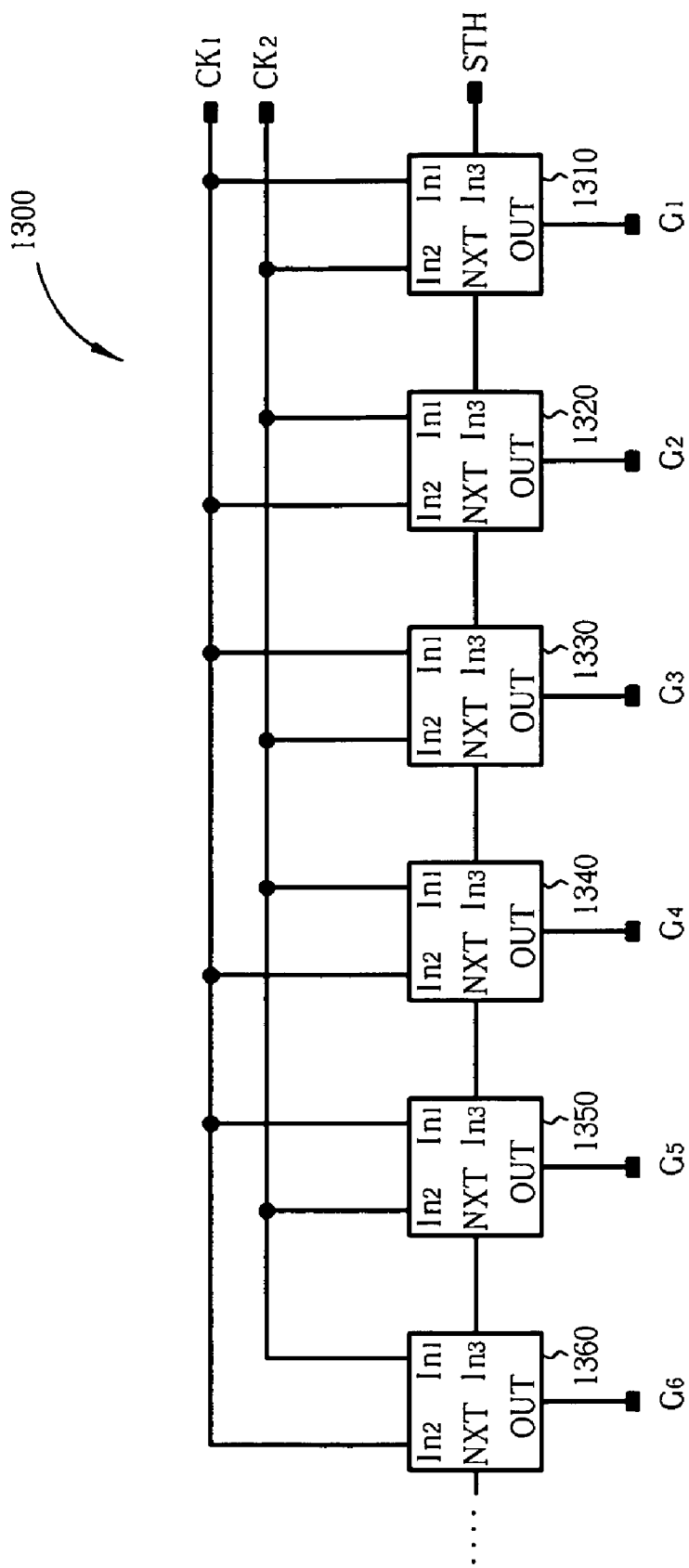
FIG. 16 shows a vertical shift register that generates non-overlapped output signals according to an embodiment of the present invention.
Figure 17:
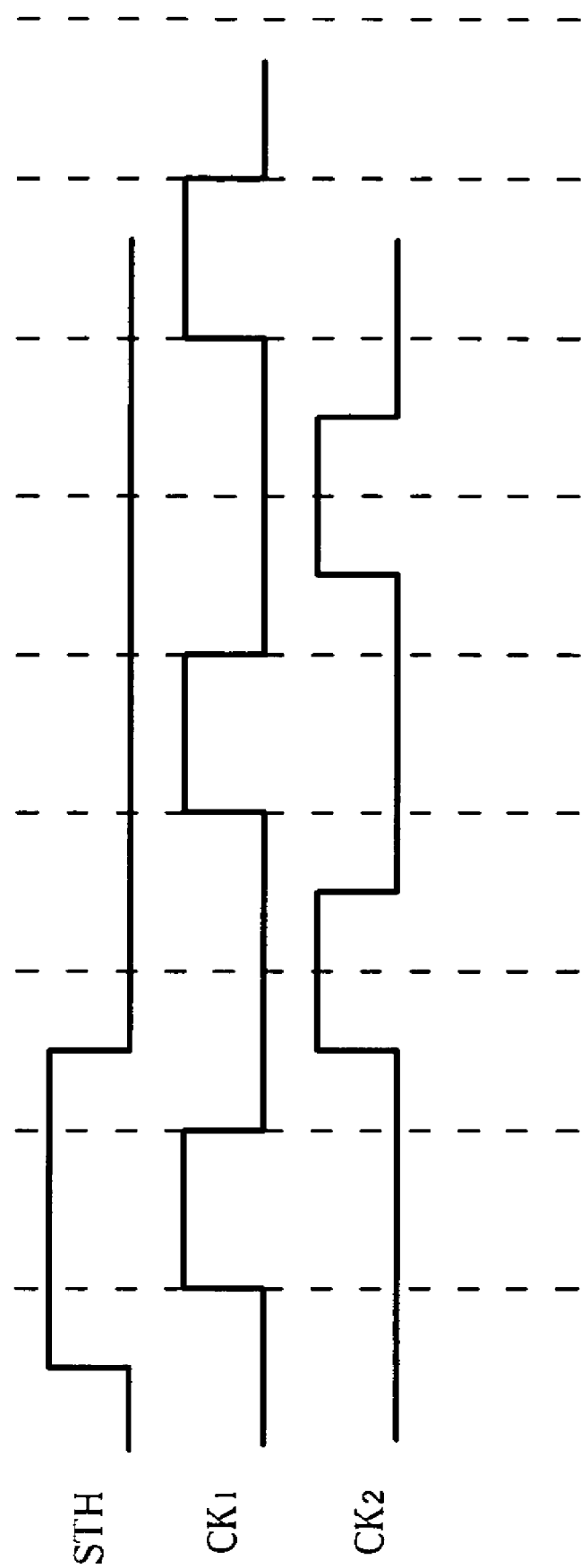
FIG. 17 shows the waveforms of the input signal STH and the two clock signals $CK_1$, $CK_2$ shown in FIG. 16.
Figure 18:
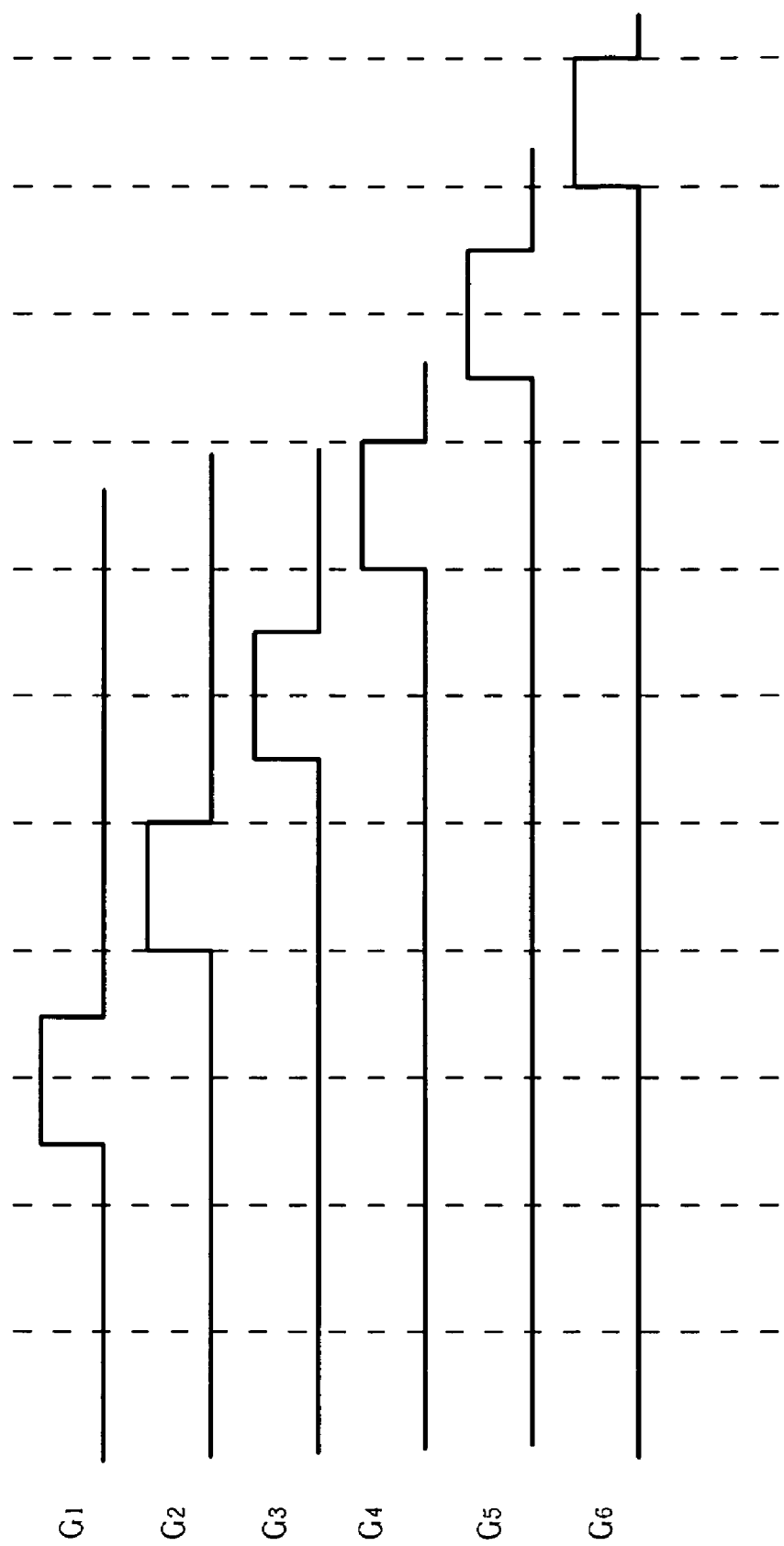
FIG. 18 shows the non-overlapped output signals generated by the vertical shift register shown in FIG. 16.

Please refer to FIG. 16. FIG. 16 shows a vertical shift register that generates non-overlapped output signals according to an embodiment of the present invention. The vertical shift register 1300 contains an exemplary number of six dynamic shift registers 1310~1360. Each of the six dynamic shift registers 1310~1360 can be chosen from the above disclosed dynamic shift registers. Each dynamic shift register receives two clock signals $CK_1$ and $CK_2$ at input terminals $In_1$ and $In_2$, and an input signal at the input terminal $In_3$. Except the initial dynamic shift register, i.e., the dynamic shift register 1310, every dynamic shift register receives an output signal of the preceding dynamic shift register, wherein the output signal is generated at the output terminal NXT. Please note that, the clock signals $CK_1$ and $CK_2$ are alternatively received by two adjacent dynamic shift registers at the input terminal $In_1$ and the input terminal $In_2$. More specifically, taking dynamic shift registers 1310 and 1320 for example, the dynamic shift register 1310 receives the clock signals $CK_1$ and $CK_2$ at input terminals $In_1$ and $In_2$ respectively; however, the dynamic shift register 1320 receives the clock signals $CK_1$ and $CK_2$ at input terminals $In_2$ and $In_1$ respectively. With the configuration shown in FIG. 13 and the waveforms of the input signal STH and the two clock signals $CK_1$, $CK_2$, shown in FIG. 17, the vertical shift register 1300 will generate non-overlapped output signals shown in FIG. 18.

Figure 19:
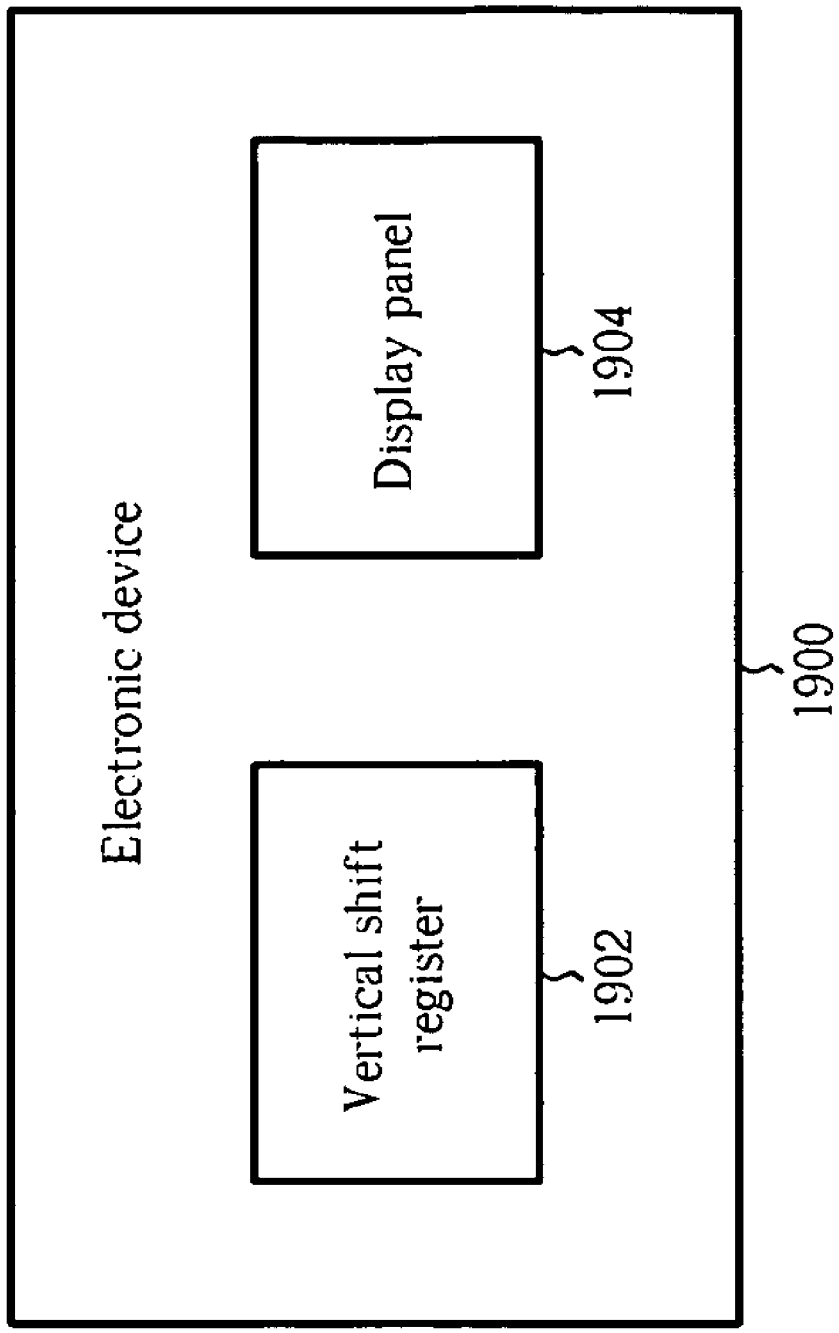
FIG. 19 shows a system for displaying images according to an embodiment of the present invention.

Please refer to FIG. 19. FIG. 19 shows a system capable of displaying images according to an embodiment of the present invention. In this embodiment, the system is implemented as an electronic device 1900. As shown in FIG. 19, the electronic device 1900 includes a vertical shift register 1902 and a display panel 1904 (e.g., an LCD panel), where the vertical shift register 1902 is part of a controller for driving the display panel 1904 to display images. It should be noted that the vertical shift register 1902 has the aforementioned circuit architecture shown in FIG. 16, and further description is omitted for brevity. In addition, the electronic device 1900 can be a mobile phone, digital camera, PDA (personal data assistant), notebook computer, desktop computer, television, car display, or portable DVD player, for example.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A system for displaying images, comprising:
   a dynamic shift register, comprising:
   a sampling unit, coupled to an incoming signal and a first input terminal of the dynamic shift register, and operative to sample the incoming signal according to a first input signal received by the first input terminal to generate a sampled value;
   a holding unit, coupled to the sampling unit, and operative to hold the sampled value;
   a first logic circuit, coupled to a second input terminal of the dynamic shift register, the holding unit and an output terminal of the dynamic shift register, and operative to generate an output signal outputted at the output terminal according to the held sampled value and a second input signal inputted into the second input terminal, wherein the first logic circuit comprises:
      a first switch, coupled to the sampled value, the second input terminal, and the output terminal, and operative to control when the second input signal is passed to the output terminal according to an inverted signal of the sampled value; and
      a second switch, coupled to the output terminal, and operative to selectively pass a voltage level to the output terminal according to the sampled value;
      wherein when the sampled value is at a first level, the second switch is turned off and the first switch is turned on, allowing the second input signal to pass through; and when the sampled value is at a second level, the first switch is turned off and the second switch is turned on, allowing the voltage level to pass through; and
   a second logic circuit, coupled to a third input terminal of the dynamic shift register and the sampling unit, and operative to receive a third input signal and level-shift the third input signal to generate the incoming signal; wherein the second logic circuit comprises an inverter operative to level-shift the third input signal to generate the incoming signal.

2. The system of claim 1, wherein the first logic circuit performs a NOR operation upon the sampled value and an inverted signal of the second input signal to generate the output signal.

3. The system of claim 1, wherein the inverter includes a P-MOSFET and an N-MOSFET, and the second logic circuit further comprises:
   a P-MOSFET, having a drain coupled to the P-MOSFET of the inverter, a source coupled to a voltage level, and a gate controlled by the second input signal or an inverted signal of the first input signal.

4. The system of claim 1, wherein the dynamic shift register further comprises an inverter connected between the second logic circuit and the sampling unit and operative to invert the incoming signal inputted into the sampling unit, and the first logic circuit performs an AND operation upon the sampled value and the second input signal.

5. The system of claim 1, wherein the dynamic shift register further comprises an inverter connected between the sampling unit and the first logic circuit and operative to invert the sampled value inputted into the first logic circuit, and the first logic circuit performs an AND operation upon an inverted signal of the sampled value and the second input signal.

6. The system of claim 1, wherein the sampling unit comprises at least a MOSFET having a gate controlled by the first input signal.

7. The system of claim 6, wherein the sampling unit is implemented by a transmission gate having an N-MOSFET and a P-MOSFET, where one of the N-MOSFET and the P-MOSFET has a gate controlled by the first input signal.

8. The system of claim 1, wherein the holding unit comprises a capacitor having a first terminal coupled to a voltage level and a second terminal coupled to the sampling unit.

9. The system of claim 1, wherein the first logic circuit performs an AND operation upon the sampled value and the second input signal.

10. The system of claim 1, further comprising a display panel, wherein the dynamic shift register is coupled to the display panel and operative to drive the display panel.

11. The system of claim 10, further comprising an electronic device, wherein the electronic device comprises the display panel and the dynamic shift register.

12. The system of claim 11, wherein the electronic device is a mobile phone, digital camera, PDA (personal data assistant), notebook computer, desktop computer, television, car display, or portable DVD player.

13. A system for displaying images, comprising:
    a dynamic shift register, comprising:
    a sampling unit, coupled to an incoming signal and a first input terminal of the dynamic shift register, and operative to sample the incoming signal according to a first input signal received by the first input terminal to generate a sampled value, the sampling unit comprising at least a MOSFET having a gate controlled by the first input signal;

a holding unit, coupled to the sampling unit, and operative to hold the sampled value, the holding unit comprising a capacitor having a first terminal coupled to a voltage level and a second terminal coupled to the sampling unit; and a first logic circuit, coupled to a second input terminal of the dynamic shift register, the holding unit and an output terminal of the dynamic shift register, and operative to allow a second input signal inputted into the second input terminal to adjust an output signal outputted at the output terminal when the sampled value held by the holding unit has a specific logic level, wherein the first logic circuit comprises:

a first switch, coupled to the sampling unit, the second input terminal, and the output terminal, and operative to control when the second input signal is passed to the output terminal according to the sampled value; and a second switch, coupled to the output terminal, and operative to selectively pass a voltage level to the output terminal according to an inverted signal of the sampled value;

wherein when the sampled value is at a first level, the second switch is turned off and the first switch is turned on, allowing the second input signal to pass through; and when the sampled value is at a second level, the first switch is turned off and the second switch is turned on, allowing the voltage level to pass through.

14. The system of claim 13, further comprising a display panel, wherein the dynamic shift register is coupled to the display panel and operative to drive the display panel.

15. The system of claim 14, further comprising an electronic device, wherein the electronic device comprises the display panel and the dynamic shift register.

16. The system of claim 15, wherein the electronic device is a mobile phone, digital camera, PDA (personal data assistant), notebook computer, desktop computer, television, car display, or portable DVD player.

17. A system for displaying images, comprising:
a vertical shift register circuit operative to generate non-overlapped signals, comprising:
a plurality of dynamic shift registers connected in a series, each dynamic shift register comprising:
a sampling unit, coupled to an incoming signal and a first input terminal of the dynamic shift register, and operative to sample the incoming signal according to a first input signal received by the first input terminal to generate a sampled value;
a holding unit, coupled to the sampling unit, and operative to hold the sampled value, wherein the sampled value is outputted as a first output signal at the a first output terminal; and
a first logic circuit, coupled to a second input terminal of the dynamic shift register, the holding unit, and a second output terminal of the dynamic shift register, and operative to generate a second output signal according to the held sampled value and a second input signal inputted into the second input terminal, wherein the first logic circuit comprises:
a first switch, coupled to the sampling unit, the second input terminal, and the output terminal, and operative to control when the second input signal is passed to the output terminal according to the sampled value; and a second switch, coupled to the output terminal, and operative to selectively pass a voltage level to the output terminal according to an inverted signal of the sampled value;

wherein when the sampled value is at a first level, the second switch is turned off and the first switch is turned on, allowing the second input signal to pass through; and when the sampled value is at a second level, the first switch is turned off and the second switch is turned on, allowing the voltage level to pass through;

wherein each dynamic shift register, except an initial dynamic shift register, receives the first output signal of a preceding dynamic shift register as the present incoming signal, and two adjacent dynamic shift registers receive two clock signals alternatively as the first input signal and the second input signal.

18. The system of claim 17, further comprising a display panel, wherein the vertical shift register circuit is coupled to the display panel and operative to drive the display panel.

19. The system of claim 18, further comprising an electronic device, wherein the electronic device comprises the display panel and the vertical shift register circuit.

20. The system of claim 19, wherein the electronic device is a mobile phone, digital camera, PDA (personal data assistant), notebook computer, desktop computer, television, car display, or portable DVD player.

21. A system for displaying images, comprising:
a dynamic shift register, comprising:
a sampling unit, coupled to an incoming signal and a first input terminal of the dynamic shift register, and operative to sample the incoming signal according to a first input signal received by the first input terminal to generate a sampled value;
a holding unit, coupled to the sampling unit, and operative to hold the sampled value; and
a first logic circuit, coupled to a second input terminal of the dynamic shift register, the holding unit and an output terminal of the dynamic shift register, and operative to generate an output signal outputted at the output terminal according to the held sampled value and a second input signal inputted into the second input terminal; wherein the first logic circuit comprises:
a first switch, coupled to the sampling unit, the second input terminal, and the output terminal, and operative to control when the second input signal is passed to the output terminal according to the sampled value; and
a second switch, coupled to the output terminal, and operative to selectively pass a voltage level to the output terminal according to an inverted signal of the sampled value;
wherein when the sampled value is at a first level, the second switch is turned off and the first switch is turned on, allowing the second input signal to pass through; and when the sampled value is at a second level, the first switch is turned off and the second switch is turned on, allowing the voltage level to pass through.

* * * * *